(12) United States Patent
Miyake et al.

(10) Patent No.: US 7,091,749 B2
(45) Date of Patent: Aug. 15, 2006

(54) SEMICONDUCTOR DEVICE

(75) Inventors: Hiroyuki Miyake, Kanagawa (JP); Yutaka Shionoiri, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 64 days.

(21) Appl. No.: 10/901,127

(22) Filed: Jul. 29, 2004

(65) Prior Publication Data

US 2005/0051802 A1     Mar. 10, 2005

Related U.S. Application Data

(63) Continuation of application No. 10/202,861, filed on Jul. 26, 2002, now Pat. No. 6,788,108.

(30) Foreign Application Priority Data

Jul. 30, 2001   (JP)   ............... 2001-229054

(51) Int. Cl.
   *H03K 19/0175*   (2006.01)
(52) U.S. Cl. ............... 326/88; 326/81; 326/83; 345/204; 345/94; 345/100; 327/390
(58) Field of Classification Search ............ 328/81, 328/83, 88
   See application file for complete search history.

(56) References Cited

U.S. PATENT DOCUMENTS

| | | | |
|---|---|---|---|
| 3,506,851 A | 4/1970 | Polkinghorn et al. |
| 3,774,055 A | 11/1973 | Bapat |
| 3,898,479 A | 8/1975 | Proebsting |
| 4,090,096 A | 5/1978 | Nagami |
| 4,390,803 A | 6/1983 | Koike |
| 4,412,139 A | 10/1983 | Horninger |
| 4,633,105 A | 12/1986 | Tsujimoto |
| 4,804,870 A | 2/1989 | Mahmud |
| 4,959,697 A | 9/1990 | Shier et al. |
| 5,467,038 A | 11/1995 | Motely et al. |
| 5,548,143 A | 8/1996 | Lee |
| 5,643,826 A | 7/1997 | Ohtani et al. |
| 5,694,061 A | 12/1997 | Morosawa et al. |
| 5,870,071 A | 2/1999 | Kawahata |
| 5,889,291 A | 3/1999 | Koyama et al. |
| 5,949,271 A | 9/1999 | Fujikura |
| 5,952,991 A | 9/1999 | Akiyama |

(Continued)

FOREIGN PATENT DOCUMENTS

EP   1063630 A2   12/2000

(Continued)

OTHER PUBLICATIONS

Munehiro Azami et al.; U.S. Appl. No. 10/127,600; Office Action dated Oct. 22, 2004.

(Continued)

*Primary Examiner*—Vibol Tan
(74) *Attorney, Agent, or Firm*—Fish & Richardson P.C.

(57) ABSTRACT

A circuit with a large load driving capability, which is structured by single polarity TFTs, is provided. With a capacitor (154) formed between a gate electrode and an output electrode of a TFT (152), the electric potential of the gate electrode of the TFT (152) is increased by a boot strap and normal output with respect to an input signal is obtained without amplitude attenuation of an output signal due to the TFT threshold value. In addition, a capacitor (155) formed between a gate electrode and an output electrode of a TFT (153) compensates for increasing the electric potential of the gate electrode of the TFT (152), and a larger load driving capability is obtained.

32 Claims, 22 Drawing Sheets

U.S. PATENT DOCUMENTS

| | | |
|---|---|---|
| 6,040,810 A | 3/2000 | Nishimura |
| 6,049,228 A | 4/2000 | Moon |
| 6,091,393 A | 7/2000 | Park |
| 6,384,804 B1 | 5/2002 | Dodabalapur et al. |
| 6,501,098 B1 | 12/2002 | Yamazaki |
| 6,522,323 B1 | 2/2003 | Sasaki et al. |
| 6,542,138 B1 | 4/2003 | Shannon et al. |
| 6,686,899 B1 | 2/2004 | Miyazawa et al. |
| 6,813,332 B1 | 11/2004 | Nagao et al. |
| 2001/0002703 A1 | 6/2001 | Koyama |
| 2001/0045565 A1 | 11/2001 | Yamazaki |
| 2002/0011973 A1 | 1/2002 | Komiya |
| 2002/0044208 A1 | 4/2002 | Yamazaki et al. |
| 2002/0089496 A1* | 7/2002 | Numao .................. 345/204 |
| 2002/0097212 A1 | 7/2002 | Miyazawa et al. |
| 2002/0158666 A1 | 10/2002 | Azami et al. |
| 2002/0167026 A1 | 11/2002 | Azami et al. |
| 2002/0190326 A1 | 12/2002 | Nagao et al. |
| 2003/0011584 A1 | 1/2003 | Azami et al. |
| 2003/0020520 A1 | 1/2003 | Miyake et al. |
| 2003/0034806 A1 | 2/2003 | Azami |
| 2003/0052324 A1 | 3/2003 | Kimura |
| 2003/0111677 A1 | 6/2003 | Miyake |
| 2004/0252111 A1* | 12/2004 | Cheon et al. ............ 345/204 |
| 2004/0257353 A1* | 12/2004 | Imamura et al. ............ 345/204 |

FOREIGN PATENT DOCUMENTS

| | | |
|---|---|---|
| EP | 1 139 326 A2 | 10/2001 |
| JP | 55-156427 | 12/1980 |
| JP | 59-16424 | 1/1984 |
| JP | 59-016424 | 1/1984 |
| JP | 60-140924 | 7/1985 |
| JP | 63-204815 | 8/1988 |
| JP | 03-165171 | 7/1991 |
| JP | 06-098081 | 4/1994 |
| JP | 09-186312 | 7/1997 |
| JP | 09-246936 | 9/1997 |
| JP | 2001/106617 | 4/2000 |
| JP | 2001-005426 | 1/2001 |
| JP | 2000/109394 | 4/2001 |
| JP | 2001-133431 | 5/2001 |
| JP | 2002-176162 | 6/2002 |
| JP | 2002/251164 | 9/2002 |

OTHER PUBLICATIONS

Foreign Communication in Singapore Application No. 200202969-2 dated Jun. 25, 2004 along with Australian Search Report dated Apr. 27, 2004 (8 pages).

US 6,646,476, 11/2003, Nagao et al. (withdrawn)

* cited by examiner

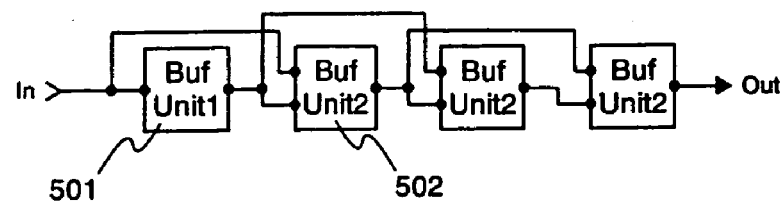
Fig.5B 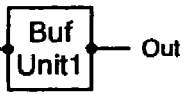 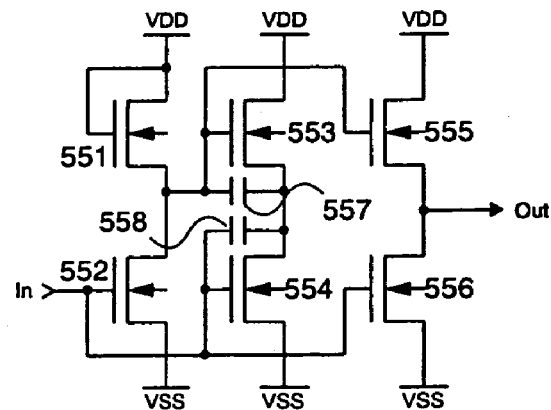
Fig.5C  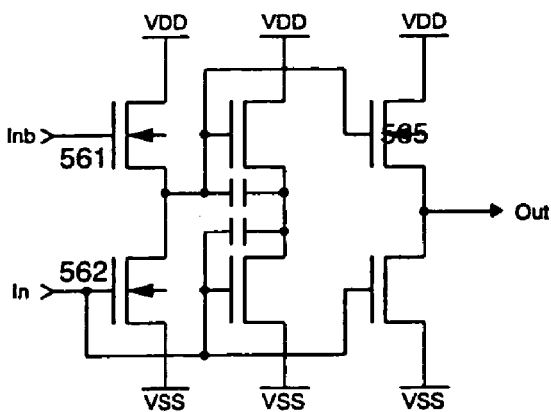

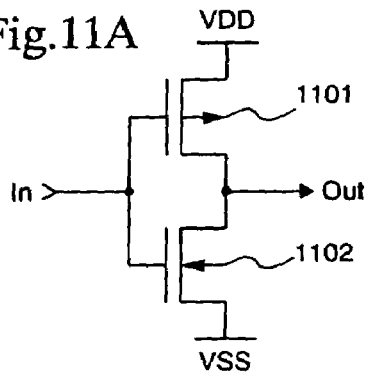
Fig.11A
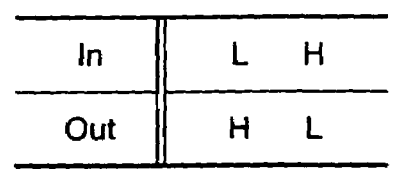
Fig.11B
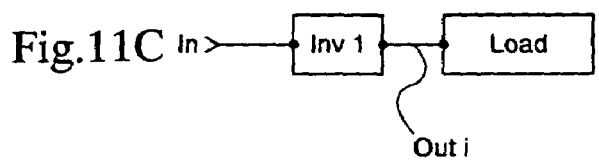
Fig.11C
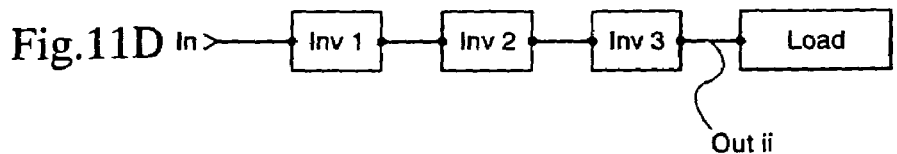
Fig.11D
Fig.11E
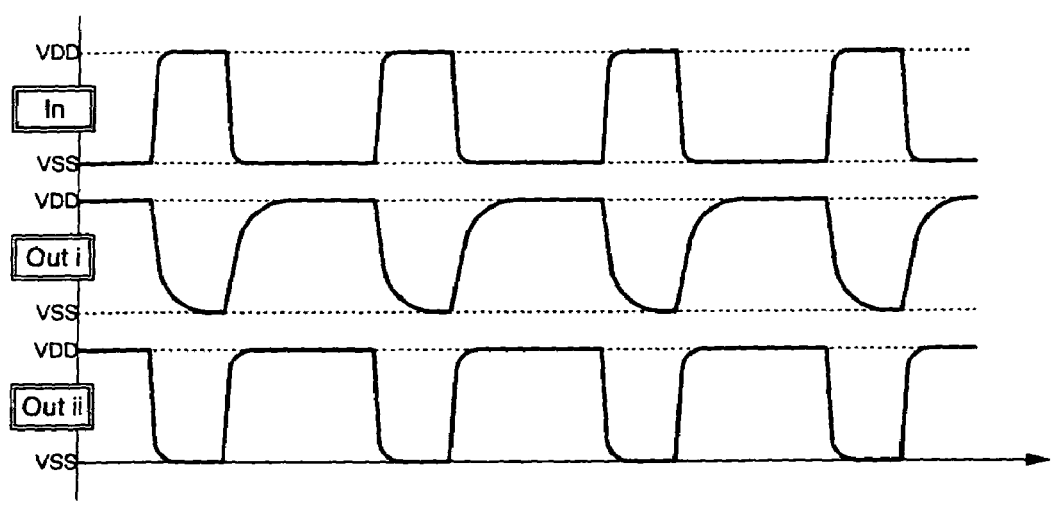

TFT in Driver Circuit | EL driver TFT

US 7,091,749 B2

SEMICONDUCTOR DEVICE

CROSS-REFERENCE TO RELATED APPLICATIONS

This application is a continuation application of U.S. application Ser. No. 10/202,861, filed Jul. 26, 2002 now a U.S. Pat. No. 6,788,108 which claims the benefit of a foreign priority application filed in Japan as Ser. No. 2001-229054 on Jul. 30, 2001. This application claims priority to each of these prior applications, and the disclosures of the prior applications are considered part of (and are incorporated by reference in) the disclosure of this application.

BACKGROUND OF THE INVENTION

1. Field of the Invention

The present invention relates to an inverter, buffer, and level shifter, and to a semiconductor device using them. Note that the term display device used within this specification includes a liquid crystal display device which employ liquid crystal elements in pixels, and a light emitting device which employ light emitting elements such as electroluminescence (EL) elements. The term semiconductor device indicates circuits that perform processing for inputting video signals into pixels disposed in the display device and displaying images. Pulse output circuits such as shift registers, inverters, buffers, and level shifters, and amplification circuits such as amplifiers are included in the category of semiconductor devices.

2. Description of the Related Art

In recent years, display devices manufactured by forming semiconductor thin films on an insulator such as a glass substrate, in particular, active matrix display devices such as LCDs (liquid crystal displays) using thin film transistors (hereinafter referred to as TFTs), are being utilized in many manufactured products, and are spreading. The active matrix display devices using TFTs have from several hundred thousands to several million pixels arranged in a matrix shape, and display of images is performed by controlling the electric charge of each pixel with TFTs disposed in the respective pixels.

In addition, techniques related to polysilicon TFTs for TFTs have been developed recently, and a driver circuit using TFTs is formed in a peripheral region of a pixel portion on a substrate simultaneously with pixel TFTs structuring pixels. The techniques contribute greatly to making a device small size and to reducing electric power consumption, and accordingly, a display device has come to be indispensable for a portion such as a display portion of a mobile information terminal, which has remarkably been applied to the extensive fields in recent years.

In general, a CMOS circuit in which an n-channel TFT and a p-channel TFT are combined are used as a circuit for structuring semiconductor devices. A CMOS inverter is shown in FIG. 11A as one example of the CMOS circuit. A p-channel TFT 1101 and an n-channel TFT 1102 are combined, and an output signal is obtained by inverting the polarity of an input signal (see FIG. 11B).

Now, as shown in FIG. 11C, there is a state in which a certain load (Load) is attached to the later stage of the CMOS inverter. If the load is excessive with respect to the size of the TFTs structuring the CMOS inverter at this point and a pulse is input from an input (In), there will be a case in which an output pulse, namely an output (Out i) of an inverter (Inv1) in FIG. 11C, is greatly dulled in both rise and fall of the pulse, compared to the waveform of the input signal, as shown in FIG. 11E. This is because the CMOS itself inverter does not have the capability of supplying a sufficient amount of electric charge for driving the load.

There normally is lot of weight given to low electric power consumption with semiconductor devices, and logical circuits are structured using relatively small size TFTs. On the other hand, display regions are becoming larger in size, and in addition, the number of pixels is increasing. The load due to the pixels is therefore large. As stated above, pulses are not output normally if a large load is present in the later stage of an inverter with a small driving capability.

A buffer is normally formed between a driver circuit portion and a pixel portion. Typically, a plurality of inverter stages are disposed in series as shown in FIG. 11D, and driving of the final load can be performed without problem by driving the inverters that are gradually increased in size. Compared to the structure of FIG. 11C, the waveform of an output (Out ii) of a buffer in the final stage (Inv4) is not greatly dulled and thus is output as a normal pulse, and the load in the later stage can be driven.

Display devices have come to be employed in the display portion of many types of electronic devices in recent years, and there is steady expansion in the number of fields in which display devices are used. Display devices are recently being actively employed even in relatively low cost electronic equipment, and therefore further cost reductions are desirable.

A multiple-layer structure is formed for a display device by repeatedly performing processes of film formation, exposure to light using a photomask, and etching. The extreme complexity of the processes therefore invites an increase in manufacturing costs. In addition, in the case in which the driver circuit and the pixel portion are formed integrally on the substrate as discussed above, some defects become a problem which affects the entire manufactured product, and has a large influence on yield.

A method in which the number of processes is reduced as much as possible, and manufacturing can be performed simply in a short period of time can be given as one method of achieving the cost reduction. A display device is manufactured with a structure that uses TFTs with a single polarity type, n-channel TFTs or p-channel TFTs, instead of a CMOS structure for the driver circuit. Processes for adding an impurity which imparts a conductivity to a semiconductor layer can thus be simply cut in half, and in addition, the number of photomasks can be reduced. This is extremely effective from the vie point of cost-related merits.

A conventionally known single polarity type circuit is explained here.

FIG. 12A shows an example in which an inverter is structured by two n-channel TFTs. The inverter is a two input type inverter with signals input to gate electrodes of TFTs 1201 and 1202. An inverted signal of one input is used as the other input.

Operation of the inverter shown in FIG. 12A is explained simply here. Note that the terms "gate electrode, input terminal, and output terminal", and the terms "gate electrode, source region, and drain region" are used separately in this specification for the names of the three electrodes of the TFT in explaining the circuit structure and operation. This is because, although there are many cases in which the voltage between the gate and the source is considered in explaining TFT operation, it is difficult to clearly differentiate the source region and the drain region of the TFT based upon the structure of the TFT and the use of unified names may, instead of being helpful, lead to confusion developing. The terms input terminal and output terminal are used in explaining the input and output of signals. The input terminal or the output terminal is referred to as the source region, and the other is referred to as the drain region, in explaining the relationship of the electric potential between the electrodes of the TFT.

First, operation of the two input inverter of FIG. 12A is explained. When H level is input to a first input (In) and L level is input to a second input (Inb), the TFT 1201 turns off and the TFT 1202 turns on. L level therefore appears in an output (Out) and the electric potential of the output becomes VSS. On the other hand, when L level is input to the first input (In), and H level is input to the second input (Inb), the TFT 1201 turns on and the TFT 1202 turns off. H level therefore appears in the output (Out) to pulled up to the VDD side.

At this point, the electric potential is considered when the output (Out) become the H level.

The L level is input to the gate electrode of the TFT 1202 when the H level is input to the gate electrode of the TFT 1201 in FIG. 12A. The TFT 1201 is therefore on, and the TFT 1202 is therefore off. Accordingly, the electric potential of the output (Out) begins to rise, and the voltage between the gate and the source of the TFT 1201 becomes equal to the threshold value VthN when the electric potential of the output (Out) becomes (VDD−VthN). That is, the TFT 1201 turns off at this instant, and therefore the electric potential of the output (Out) cannot rise any further.

A circuit in which a plurality of stages of the inverters shown FIG. 12A are connected in series is shown in FIG. 12B. The output of a certain stage becomes the input of the next stage with this type of circuit. As discussed above, waveforms in which the amplitude is attenuated by VthN with respect to the input signal appear in an output (Out i) of a first stage and an output (Out ii) of the next stage. An output (Out iii) of a third stage is additionally attenuated by VthN compared with the first stage output (FIG. 12C). Similarly, attenuation of the amplitude due to the threshold voltage continues to develop and overlap throughout the stages, the amplitude of the waveform shrinks rapidly, and the circuit cannot function as a satisfactory circuit.

A boot strap method is known in order to resolve this problem in structuring the circuit by using single polarity type TFTs. A basic circuit which functions by using the boot strap method is shown in FIG. 13A.

FIG. 13A is an inverter structured by three n-channel TFTs 1301 to 1303 and a capacitor means 1304, as disclosed in JP 3092596 B. A signal is input to a gate electrode of the TFT 1303, and the inverted signal of the signal is input to an input terminal of the TFT 1301.

Operation is explained. The amplitude of the input signal is VDD to VSS here. Refer to FIG. 13A and FIG. 13B. FIG. 13B is a diagram showing an input signal (In), an electric potential (Vf) of a gate electrode of the TFT 1302, and an output signal (Out).

When a H level signal is input to the input (In), and a L level signal is input to the inverted input (Inb), the electric potential of the gate electrode of the TFT 1301 is VDD to be in an on state, and therefore the electric potential of the gate electrode of the TFT 1302 is L level to turn off. On the other hand, the H level is input to the gate electrode of the TFT 1303 to turn on, and L level appears at the output (Out).

When a L level signal is input to the input (In), and an H level signal is input to the inverted input (Inb), the electric potential of the gate electrode of the TFT 1301 is VDD to be in an on state, and therefore the electric potential of the gate electrode of the TFT 1302 is H level. However, the electric potential of the gate electrode of the TFT 1301 is VDD, and therefore the electric potential of an output terminal of the TFT 1301, that is the electric potential of the gate electrode of the TFT 1302, becomes (VDD−VthN) to place the TFT 1301 in an off state. The gate electrode of the TFT 1302 is thus placed in a floating state at this instant. On the other hand, the TFT 1303 turns off.

The voltage between the gate and the source of the TFT 1302 rises above the TFT threshold voltage, the TFT 1302 therefore turns on, and the electric potential of an output terminal of the TFT 1302 is pulled up the to VDD side. However, the electric potential of the gate electrode of the TFT 1302 is (VDD−VthN) at this point, and the electric potential of the output terminal of the TFT 1302 can thus only increase to (VDD−2VthN).

The capacitor 1304 is formed between the output terminal and the gate electrode of the TFT 1302, however, and the gate electrode of the TFT 1302 is in a floating state. Therefore the electric potential of the gate electrode of the TFT 1302 rises by ΔVf shown in (ii) of FIG. 13B due to capacitive coupling along with the rise in the electric potential of the output terminal of the TFT 1302. The electric potential of the gate electrode of the TFT 1302 is thus greater than (VDD+VthN), and therefore the electric potential of the output terminal of the TFT 1302 then becomes equal to VDD. Note that a dotted line denoted by reference numeral 1350 in (iii) of FIG. 13B is an output example in the case of using the inverter shown in FIGS. 12A and 12B.

The inverter shown in FIG. 13A outputs an inverted signal without amplitude attenuation due to the threshold value of the TFT by the aforementioned procedure. A method of operating the electric potential of a node in a floating state by utilizing capacitive coupling between two nodes is referred to as a boot strap method.

It takes time for charging a load in the case in which the load attached to the later stage is large in an inverter that uses a boot strap method, and therefore the rise time becomes long. It is possible to increase the effect of the boot strap by making the capacitor 1304 larger. Conversely, however, a delay in the increase of the electric potential of the output with respect to the input becomes long if the capacitor is made too large, thus the size of the capacitor is limited.

The rise time may become long, or the boot strap may not function sufficiently and the amplitude of the output signal may not be able to be normalized (specifically, H level may not be sufficiently brought up), in the cases in which the load attached to the later stage of the output is additionally large, the amplitude of the input signal is small (H level is low), the threshold value of the TFT is large, and parasitic capacitance in the gate electrode of the TFT in a floating state is large during boot strap operations, and similar cases.

SUMMARY OF THE INVENTION

The present invention has been made in view of the above, and an object of the present invention is therefore to provide a circuit which with a high load driving capability, which is structured to make a rise time short and to make the amplitude of an output signal normal in cases stated above.

As shown in FIG. 1A, there is a structure in which two TFTs are added to the structure of FIG. 13A. The TFTs 1302 and 1303 in FIG. 13A have roles for boot strap operation and for electrical charge and discharge of a load of a latter stage. However, TFTs 102 and 103 contribute only to boot strap operations in the structure shown in FIG. 1A, and TFTs 105 and 106 are formed as TFTs that perform electrical charge and discharge of a load. With such structure, it is possible to obtain good operation with no loss of function even in the case in which the load attached to a later stage becomes somewhat large.

In FIG. 1A, the electric potential of a gate electrode of the TFT 102 in a floating state is taken as $V_1$, and the electric potential of an output electrode of the TFT 102 at this time is taken as $V_2$. A capacitor 104 and a capacitance due to parasitic capacitance and the like exist in the gate electrode of the TFT 102, and their values are taken as $C_1$ and $C_0$, respectively.

$V_2$ fluctuates from $V_2(0)$ to $V_2(1)$ (where $V_2(0)<V_2(1)$). If the value of this fluctuation is taken as $\Delta V_2$, the electric potential of $V_1$ also fluctuates from $V_1(0)$ to $V_1(1)$ (where $V_1(0)<V_1(1)$) due to capacitive coupling of $C_1$. If the value of the fluctuation is taken as $\Delta V_1$, the relationship can be shown by the following equation:

$$\Delta V_1 = \Delta V_2 [C_1/(C_0+C_1)] \quad \text{(Eq. 1)}$$

There are two ways for increasing $\Delta V_1$, namely increasing the amount of the fluctuation in the electric potential of the gate electrode of the TFT 102 in a floating state: (1) increasing the value of $[C_1/(C_0+C_1)]$, and (2) increasing $\Delta V_2$. In the former case, the coupling capacitance $C_1$ between the gate electrode and the output electrode of the TFT 102 sufficiently is made large with respect to the parasitic capacitance $C_0$. In the latter case, $\Delta V_2=[V_2(1)-V_2(0)]$, and therefor a method of reducing $V_2(0)$ and a method of increasing $V_2(1)$ can be considered. It is difficult to increase $V_2(1)$ to be equal to or greater than VDD with this structure, and therefore the method of reducing $V_2(0)$ is employed.

The voltage between a gate and a source of the TFT 102 can be increased by reducing $V_2(0)$, and a larger amount of drain current can be made to flow. Shortening of the rise time can thus be expected.

In order to achieve such means, as shown in FIG. 1B, a capacitor means 155 is formed between a gate electrode and an output terminal of a TFT 153 in addition to a capacitor means 154 formed between a gate electrode and an output terminal of a TFT 152.

The load driving capability can be increased with such structure, and therefore the number of stages for buffers and the like can be made smaller, which lead to redaction in the surface area occupied by circuits.

The driver circuit and the pixel portion can be structured by using TFTs with the single polarity, and therefore a portion of processes for adding impurity elements to semiconductor layers can be omitted in a process of manufacturing a display device.

Structures of the present invention are described below.

A semiconductor device according to the present invention is characterized by comprising:

first and second transistors each comprising an input terminal electrically connected to a first electric power source;

third and fourth transistors each comprising an input terminal electrically connected to a second electric power source;

a voltage compensator circuit comprising: a fifth transistor comprising an output terminal electrically connected to a gate electrode of the first transistor and a gate electrode of the second transistor; and a capacitor between the output terminal of the fifth transistor and an output terminal of the first transistor;

a first signal input portion for inputting a first signal to a gate electrode of the third transistor and a gate electrode of the fourth transistor;

a second signal input portion for inputting a second signal to an input terminal of the fifth transistor; and a signal output portion, in which:

each of the first through the fifth transistors have the same conductivity type, the output terminal of the first transistor and an output terminal of the third transistor are electrically connected, an output terminal of the second transistor and an output terminal of the fourth transistor are electrically connected to the signal output portion, a gate electrode of the fifth transistor is electrically connected to the first electric power source or to a third electric power source, and the voltage compensator circuit compensates for amplitude attenuation of a signal output from the signal output portion.

A semiconductor device according to the present invention is characterized by comprising:

first and second transistors each comprising an input terminal electrically connected to a first electric power source;

third and fourth transistors each comprising an input terminal electrically connected to a second electric power source;

a voltage compensator circuit comprising: a fifth transistor comprising an output terminal electrically connected to a gate electrode of the first transistor and a gate electrode of the second transistor; a first capacitor between a gate electrode of the first transistor and an output terminal of the first transistor; and a second capacitor between a gate electrode of the third transistor and an output terminal of the third transistor;

a first signal input portion for inputting a first signal to a gate electrode of the third transistor and a gate electrode of the fourth transistor;

a second signal input portion for inputting a second signal to an input terminal of the fifth transistor; and a signal output portion, in which:

each of the first through the fifth transistors have the same conductivity type, the output terminal of the first transistor and the output terminal of the third transistor are electrically connected, an output terminal of the second transistor and an output terminal of the fourth transistor are electrically connected to the signal output portion, a gate electrode of the fifth transistor is electrically connected to the first electric power source or to a third electric power source, and the voltage compensator circuit compensates for amplitude attenuation of a signal output from the signal output portion.

The semiconductor device according to the present invention is characterized in that the capacitor is formed by:

two electrodes selected from the group consisting of an active layer, a gate electrode, and a wiring; and an insulating material between the two electrodes.

The semiconductor device according to the present invention is characterized in that one of the first and second capacitor means is formed by:

two electrodes selected from the group consisting of an active layer, a gate electrode, and a wiring; and an insulating material between the two electrodes.

The semiconductor device according to the present invention is characterized in that:
electric potential of the second electric power source is less than electric potential of the first electric power source when the conductivity type is n-channel, and
the electric potential of the second electric power source is more than the electric potential of the first electric power source when the conductivity type is p-channel.

The semiconductor device according to the present invention is characterized in that:
electric potential of the third electric power source is more than electric potential of the second electric power source and less than electric potential of the first electric power source when the conductivity type is n-channel, and
the electric potential of the third electric power source is less than the electric potential of the second electric power source and more than the electric potential of the first electric power source when the conductivity type is p-channel.

A semiconductor device according to the present invention is characterized by comprising:
first and second transistors each comprising an input terminal electrically connected to a first electric power source;
third and fourth transistors each comprising an input terminal electrically connected to a second electric power source;
a voltage compensator circuit comprising: a fifth transistor comprising an input terminal electrically connected to the first electric power source and an output terminal electrically connected to a gate electrode of the first transistor and a gate electrode of the second transistor; a sixth transistor comprising an input terminal electrically connected to the second electric power source and an output terminal electrically connected to the gate electrode of the first transistor and the gate electrode of the second transistor; and a capacitor between the gate electrode and an output terminal of the first transistor;
a first signal input portion for inputting a first signal to a gate electrode of the third transistor, a gate electrode of the fourth transistor, and a gate electrode of the sixth transistor;
a second signal input portion for inputting a second signal to an input terminal of the fifth transistor; and
a signal output portion,
in which:
each of the first through the sixth transistors have the same conductivity type,
the output terminal of the first transistor and an output terminal of the third transistor are electrically connected,
an output terminal of the second transistor and an output terminal of the fourth transistor are electrically connected to the signal output portion,
a gate electrode of the fifth transistor is electrically connected to the first electric power source or to a third electric power source, and
the voltage compensator circuit compensates for amplitude attenuation of a signal output from the signal output portion.

A semiconductor device according to the present invention is characterized by comprising:
first and second transistors each comprising an input terminal electrically connected to a first electric power source;
third and fourth transistors each comprising an input terminal electrically connected to a second electric power source;
a voltage compensator circuit comprising: a fifth transistor comprising an input terminal electrically connected to the first electric power source and an output terminal electrically connected to a gate electrode of the first transistor and a gate electrode of the second transistor; a sixth transistor comprising an input terminal electrically connected to the second electric power source and an output terminal electrically connected to the gate electrode of the first transistor and the gate electrode of the second transistor; a first capacitor between the gate electrode and an output terminal of the first transistor; and a second capacitor between a gate electrode and an output terminal of the first transistor;
a first signal input portion for inputting a first signal to the gate electrode of the third transistor, a gate electrode of the fourth transistor, and a gate electrode of the sixth transistor;
a second signal input portion for inputting a second signal to an input terminal of the fifth transistor; and
a signal output portion,
in which:
each of the first through the sixth transistors have the same conductivity type,
the output terminal of the first transistor and an output terminal of the third transistor are electrically connected,
an output terminal of the second transistor and an output terminal of the fourth transistor are electrically connected to the signal output portion,
a gate electrode of the fifth transistor is electrically connected to the first electric power source or to a third electric power source, and
the voltage compensator circuit compensates for amplitude attenuation of a signal output from the signal output portion.

The semiconductor device according to the present invention is characterized in that the capacitor is formed by:
two electrodes selected from the group consisting of an active layer, a gate electrode, and a wiring; and
an insulating material between the two electrodes.

The semiconductor device according to the present invention is characterized in that one of the first and second capacitor means is formed by:
two electrodes selected from the group consisting of an active layer, a gate electrode, and a wiring; and
an insulating material between the two electrodes.

The semiconductor device according to the present invention is characterized in that:
wherein electric potential of the second electric power source is less than electric potential of the first electric power source when the conductivity type is n-channel, and
wherein the electric potential of the second electric power source is more than the electric potential of the first electric power source when the conductivity type is p-channel.

BRIEF DESCRIPTION OF THE DRAWINGS

In the accompanying drawings:

FIGS. 5A to 5C are diagrams showing the structure of a buffer used in a display device manufactured by an embodiment;

FIGS. 11A to 11E are diagrams showing the relationship between CMOS inverter operation and load;

DETAILED DESCRIPTION OF THE PREFERRED EMBODIMENTS

Embodiment Mode

Figure 1A:
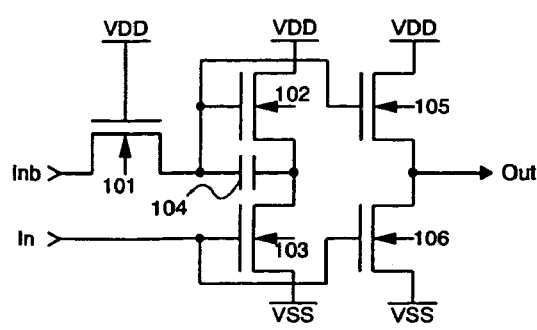
FIGS. 1A to 1C are diagrams showing an embodiment mode of the present invention.
Figure 1B:
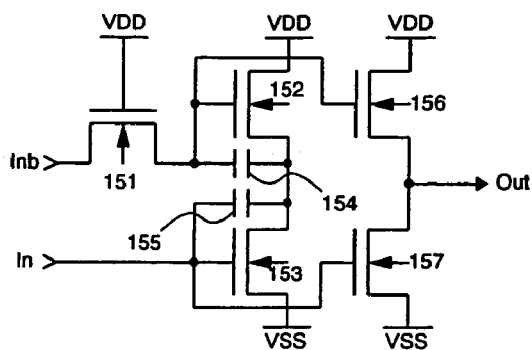

Operation of the circuits shown in FIGS. 1A and 1B is explained. Basic circuit operation is explained using FIGS. 13A and 13B. The L level appears from a signal output portion (Out) when the H level is input to a first signal input portion (In) and the L level is input to a second signal input portion (Inb), and the H level appears from the signal output portion (Out) when the L level is input to the first signal input portion (In) and the H level is input to the second signal input portion (Inb). At this time, attenuation in the voltage amplitude caused by the TFT threshold value is compensated by using a boot strap method, and an output with a normal amplitude can be obtained. In addition, boot strap operations, and load charge and discharge operations are each performed by independent TFTs, and therefore high speed operation is possible, and a sufficient load driving capability can be achieved.

In addition, there is a specific operation at the instant of changing the signal input to the first signal input portion (In) from the H level to the L level in the structure of FIG. 1B. An explanation is as follows.

Figure 1C:
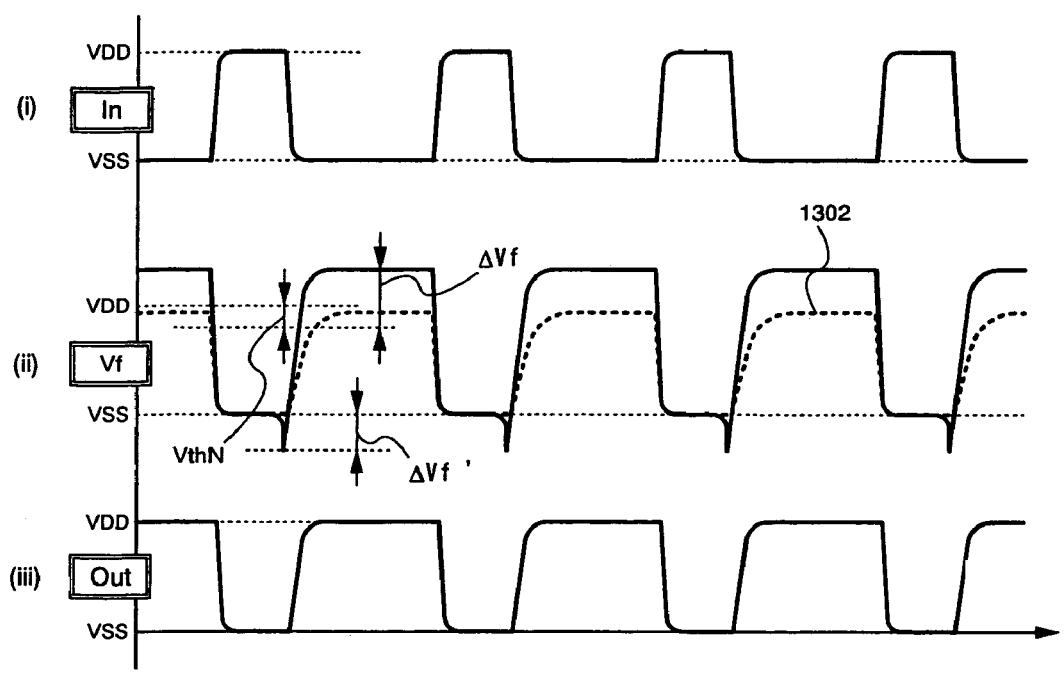

FIG. 1C is a diagram showing signal waveforms of respective portions related to operation of an inverter to which the present invention is applied. The operation is explained using FIGS. 1B and 1C. Note that the amplitude of the input signal is from VDD to VSS.

The H level is input to the first signal input portion (In), and TFTs 153 and 157 are placed in an on state. On the other hand, VDD is always input to a gate electrode of a TFT 151, and gate electrodes of TFTs 152 and 156 become the L level through the TFT 151 to be turn off when the L level is input to the second signal input portion (Inb). The L level therefore appears in the signal output portion (Out).

The signal input to the first signal input portion (In) then begins to become the L level from the H level. The TFT 153 turns off when the electric potential falls below the threshold value of the TFT 153. An output terminal of the TFT 153 is therefore momentarily in a floating state. In addition, the electric potential of the signal input to the first signal input portion (In) drops, that is, the electric potential of a gate electrode of the TFT 153 drops. The electric potential of the output terminal of the TFT 153 in a floating state then drops by an amount denoted by $\Delta V_f$ due to capacitive coupling by a capacitor 155 between the gate electrode and the output terminal of the TFT 153, as shown in FIG. 1C.

At the same time, the signal input to the second signal input portion (Inb) becomes the H level from the L level. The electric potential of the gate electrodes of the TFTs 152 and 156 therefore rises to be placed in a floating state when the electric potential becomes (VDD−VthN).

Figure 13A:
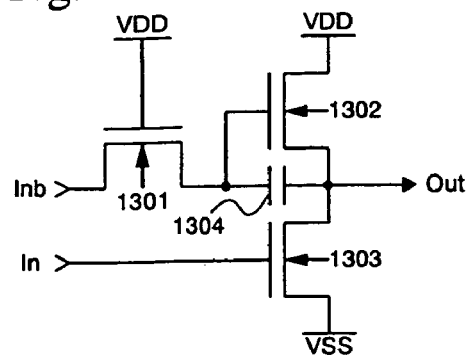
FIGS. 13A and 13B are diagrams showing circuit operation in accordance with a boot strap method.
Figure 13B:
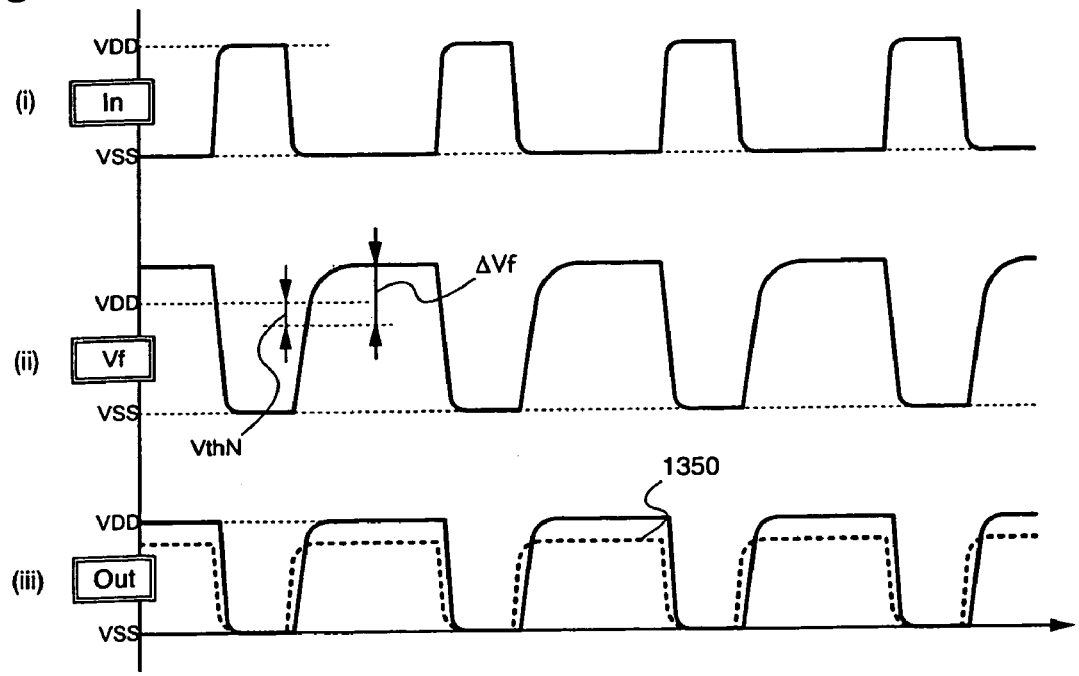

The electric potential of an output terminal of the TFT 152 is (VSS−$\Delta V_f$) here, and the voltage between a gate and a source of the TFT 152 becomes larger than the voltage between the gate and the source of the TFT 1302 in the circuit shown in FIG. 13A. That is, more electric current flows in the TFT 152 than in the TFT 1302.

The increase in the electric potential of the output terminal of the TFT 152 therefore becomes faster than the increase in the electric potential of the output terminal of the TFT 1302. Due to the boot strap, the speed, at which the electric potentials of the gate electrodes of the TFTs 152 and 156 lift up, also becomes faster than the speed at which the electric potential of the gate electrode of the TFT 1302 does.

The H level therefore appears at the signal output portion (Out), and the time for the increase in the electric potential becomes shorter than that of the circuit shown in FIG. 13A. In addition, the amount of electric current flowing in the TFTs 152 and 156 increases, and therefore the electric potential of the gate electrode of the TFT 152 can also increase to a higher value than (VDD+VthN) due to normal boot strap operations if the load attached to the output stage is large. In the case of the circuit using the conventional boot strap method shown in FIG. 13A, there are some cases where the electric potential of the gate electrode of the TFT 1302 in a floating state cannot be brought up to an electric potential that is higher than (VDD+VthN), as shown in the dotted line waveform in FIG. 1B, and therefore the amplitude of the output signal is also attenuated.

With FIGS. 2A to 2E, transitional operations at the instant of changing the signal input to the first signal input portion (In) from the H level to the L level are explained in detail.

Figure 2A:
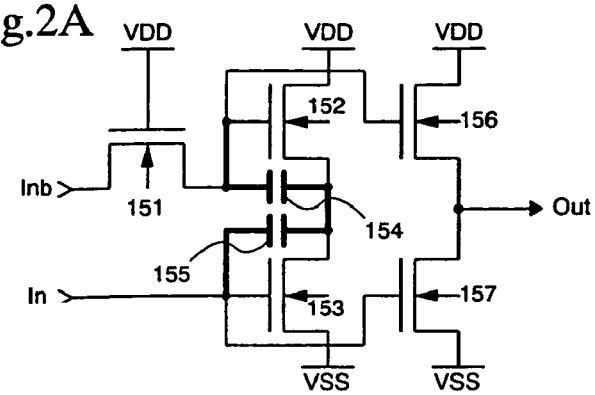
FIGS. 2A to 2E are diagrams showing the electric potential of each node of the circuit shown in FIG. 1A to 1C during boot strap operation.

FIG. 2A is similar to the circuit shown in FIG. 1B. It is noted that attention is paid to only the capacitor 154 and the capacitor 155, and changes in the electric potential at the nodes of both ends of the capacitors here.

Figure 2B:
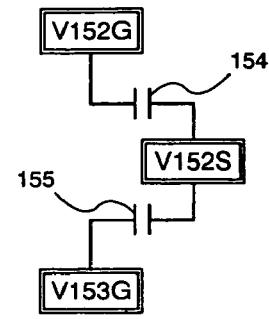

FIG. 2B is a diagram showing an extraction of the capacitors 154 and 155. A node which is corresponding to the gate electrode of the TFT 152 is denoted by V152G, a node which is corresponding to the output terminal of the TFT 152 is denoted by V152S, and a node which is corresponding to a gate electrode of the TFT 153 is denoted by V153G.

Figure 2C:
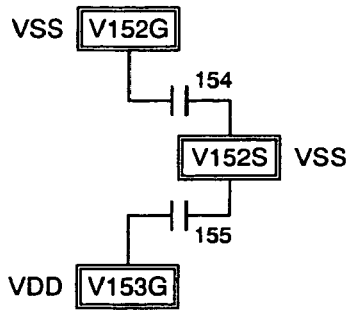

FIG. 2C shows a state in which the H level is input to the first signal input portion (In), and the L level is input to the second signal input portion (Inb). The electric potential of the node V152G at this point is VSS, the electric potential of the node V152S is VSS, and the electric potential of the node V153G is VDD.

Figure 2D:
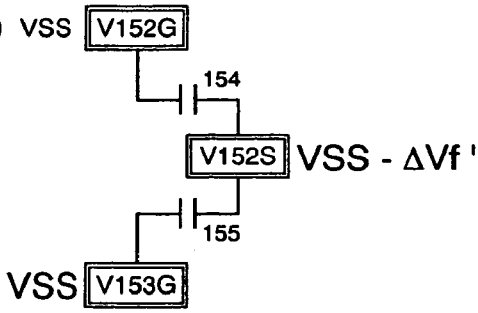
Figure 2E:
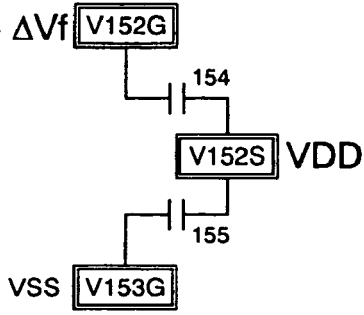

As shown in FIG. 2D, the signal input to the first signal input portion (In) then becomes the L level from the H level. The electric potential of the gate electrode of the TFT 153 therefore drops, and the TFT 153 turns off when the electric potential falls lower than the threshold value. The node V152S is then placed in a floating state. In addition, the electric potential of the node V153G also drops after falling below the threshold value of the TFT 153, and the electric potential becomes VSS. The electric potential of the node V152S drops by ΔVf due to capacitive coupling by the capacitor 155 with the node V153G. The electric potential of the node V153G therefore becomes (VSS−ΔVf), as shown in FIG. 2D.

At the same time, the signal input to the second signal input portion (Inb) becomes the H level from the L level. The TFT 152 thus turns on, and the node V152G is placed in a floating state when the electric potential of the node V152G becomes (VDD−VthN). Next, there is a further increase by ΔVf due to the boot strap, and the electric potential of the node V152G becomes (VDD−VthN+ΔVf). The electric potential of the node V152S therefore increases to VDD. At the same time, the electric potential of the gate electrode of the TFT 156 also becomes equal to the electric potential of the node V152G, and therefore the H level increased normally to VDD appears in the signal output portion (Out).

It is possible to obtain a sufficient driving ability in accordance with the operations shown above in the present invention, even if there is a large load in a later stage. Note that a structure that uses p-channel TFTs may of course be employed although an example of a case in which the polarity of the TFTs is n-channel is explained in this Embodiment Mode.

Embodiments

Embodiments of the present invention are discussed below.

Embodiment 1

In the circuits shown in FIGS. 1A and 1B and explained in the Embodiment Mode, the role of placing the gate electrode of the TFT 102 in a floating state is accomplished by only the TFT 101. There is the fact discussed above that the gate electrode of the TFT 102 is placed in a floating state when the electric potential of the gate electrode of the TFT 102 becomes (VDD−VthN). If the H level of the input signal is not satisfy (VDD−VthN), the TFT 101 does not turn off, and therefore the gate electrode of the TFT 102 is not placed in a floating state, and accordingly the boot strap does not work.

Figure 9A:
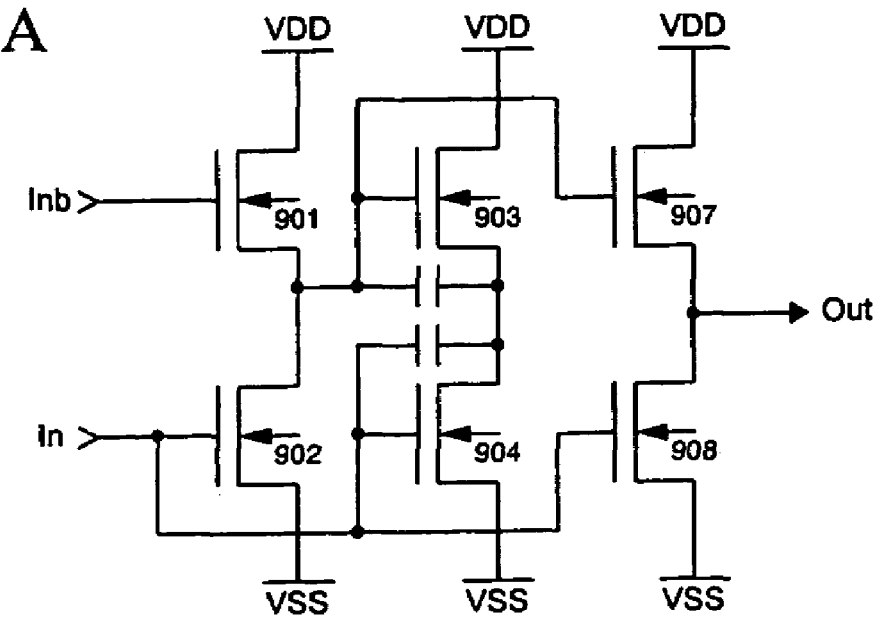
FIGS. 9A and 9B are diagrams showing an embodiment of the present invention.

The circuit shown in FIG. 9A is used in the above case. A difference between the circuits shown in FIG. 9A and in FIG. 1A is that two TFTs, a TFT 901 and a TFT 902, are used in order to place a gate electrode of a TFT 903 in a floating state. The above stated condition is considered with the circuit of FIG. 9A. The voltage amplitude of an input signal is VDD0(Hi) to VSS(Lo), and the relationship among the electric potentials is:

$$VSS<VthN<VDD0<(VDD-VthN) \quad (Eq.\ 2).$$

When the H level is input to the first signal input portion (In) and the L level is input to the second signal input portion (Inb), the TFT 902, a TFT 904, and a TFT 908 turn on. In addition, the TFT 901 turns off, and therefore the L level is input to a gate electrode of the TFT 903 and a gate electrode of a TFT 907 and the TFTs 903 and 907 turn off. The L level thus appears in the signal output portion (Out).

On the other hand, when the L level is input to the first signal input portion (In) and the H level is input to the second signal input portion (Inb), then the TFT 902, the TFT 904, and the TFT 908 turn off. Further, the TFT 901 turns on, and the electric potentials of the gate electrodes of the TFTs 903 and 907 increase. The electric potential of the gate electrode of the TFT 901 at this point is VDD0, and therefore a floating state arises with certainty when the electric potential of the gate electrodes of the TFTs 903 and 907 becomes (VDD0−VthN). The H level then appears normally in the signal output portion (Out) due to the boot strap, as shown in the Embodiment Mode.

The output with an amplitude of (VDD−VSS) can be obtained for input of signals with an amplitude of (VDD0−VSS) if the circuit shown in FIG. 9A is used. That is, the circuit can be made to function as a level shifter.

Figure 9B:
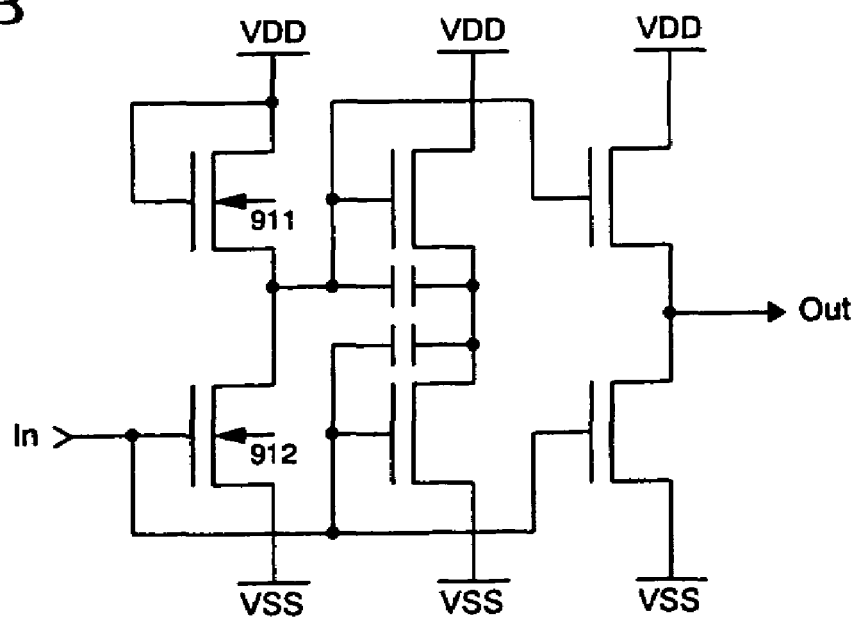

FIG. 9B is a similar circuit. A gate electrode of a TFT 911 is connected to an electric power source VDD, and signals are input only to a gate electrode of a TFT 912. It is thus possible to obtain similar operation to the circuit shown in FIG. 9A with a single input type circuit.

Embodiment 2

This embodiment gives a description on a method of manufacturing TFTs for driving circuit provided in a pixel portion and in the periphery of the pixel potion formed on the same substrate. Note that the processes of manufacturing of a liquid crystal device is described as an example here, as mentioned above, there is no particular limitation on the liquid crystal display device.

Figure 7A:
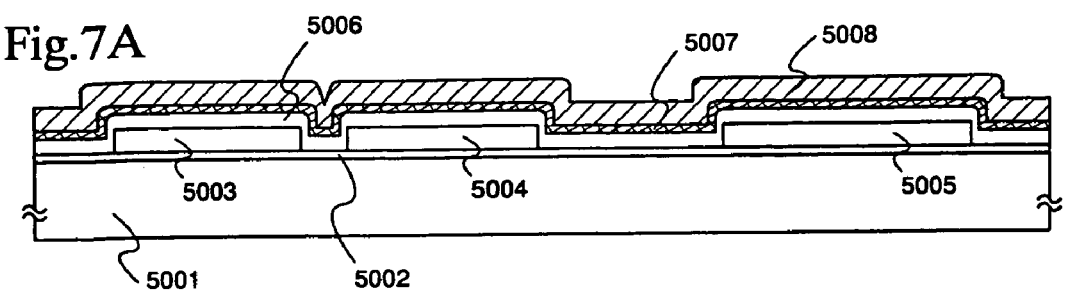
FIGS. 7A to 7C are diagrams showing an example of a process of manufacturing a display device.

First, as shown in FIG. 7A, a base film 5002 is formed from an insulating film such as a silicon oxide film, a silicon nitride film, and a silicon oxynitride film on a glass substrate 5001. The substrate 5001 is formed of barium borosilicate glass typical example of which is Corning #7059 glass or Corning #1737 glass (product of Corning Incorporated), or of aluminoborosilicate glass. The base film 5002 is, for example, (not shown) a laminate of a silicon oxynitride film that is formed from $SiH_4$, $NH_3$, and $N_2O$ by plasma CVD to a thickness of 10 to 200 nm (preferably 50 to 100 nm) and a silicon oxynitride hydride film formed from $SiH_4$ and $N_2O$ by plasma CVD to a thickness of 50 to 200 nm (preferably 100 to 150 nm).

A semiconductor film having an amorphous structure is crystallized by laser crystallization or a known thermal crystallization method to form a crystalline semiconductor film. The crystalline semiconductor film makes island-like semiconductor layers 5003 to 5005. The island-like semiconductor layers 5003 to 5005 each have a thickness of 25 to 80 nm (preferably 30 to 60 nm). No limitation is put on the choice of material of the crystalline semiconductor film but it is preferable to use silicon or a silicon germanium (SiGe) alloy.

When the crystalline semiconductor film is formed by laser crystallization, a pulse oscillation-type or continuous wave excimer laser, YAG laser, or YVO$_4$ laser is used. Laser light emitted from a laser as those given in the above is desirably collected into a linear beam by an optical system before irradiating the semiconductor film. Conditions of crystallization are set suitably by an operator. However, if an excimer laser is used, the pulse oscillation frequency is set to 30 Hz and the laser energy density is set to 100 to 400 mJ/cm$^2$ (typically 200 to 300 mJ/cm$^2$). If a YAG laser is used, second harmonic thereof is employed and the pulse oscillation frequency is set to 1 to 10 kHz while setting the laser energy density to 300 to 600 mJ/cm$^2$ (typically 350 to 500 mJ/cm$^2$). The laser light is collected into a linear beam having a width of 100 to 1000 μm, for example, 400 μm, to irradiate the entire substrate. The substrate is irradiated with the linear laser light with the beams overlapping each other at an overlap ratio of 80 to 98%.

Next, a gate insulating film 5006 is formed so as to cover the island-like semiconductor layers 5003 to 5005. The gate insulating film 5006 is formed from an insulating film containing silicon by plasma CVD or sputtering to a thickness of 40 to 150 nm. In this embodiment, a silicon oxynitride film having a thickness of 120 nm is used. Needless to say, the gate insulating film is not limited to a silicon oxynitride film but may be a single layer or a laminate of other insulating films containing silicon. For example, if a silicon oxide film is used for the gate insulating film, the film is formed by plasma CVD in which TEOS (tetraethyl orthosilicate) is mixed with O$_2$ and the reaction pressure is set to 40 Pa, the substrate temperature to 300 to 400° C., the frequency is set high to 13.56 MH$_z$, and the power density is set to 0.5 to 0.8 W/cm$^2$ for electric discharge. The silicon oxide film thus formed can provide the gate insulating film with excellent characteristics when it is subjected to subsequent thermal annealing at 400 to 500° C.

On the gate insulating film 5006, a first conductive film 5007 and a second conductive film 5008 for forming gate electrodes are formed. In this embodiment, the first conductive film 5007 is a Ta film with a thickness of 50 to 100 nm and the second conductive film 5009 is a W film with a thickness of 100 to 300 nm (FIG. 7A).

The Ta film is formed by sputtering in which Ta as a target is sputtered with Ar. In this case, an appropriate amount of Xe or Kr is added to Ar to ease the internal stress of the Ta film and thus prevent the Ta film from peeling off. The resistivity of a Ta film in α phase is about 20 μΩcm and is usable for a gate electrode. On the other hand, the resistivity of a Ta film in β phase is about 180 μΩcm and is not suitable for a gate electrode. A Ta film in α phase can readily be obtained when a base with a thickness of about 10 to 50 nm is formed from tantalum nitride (TaN) that has a crystal structure approximate to that of the α phase Ta film.

The W film is formed by sputtering with W as a target. Alternatively, the W film may be formed by thermal CVD using tungsten hexafluoride (WF$_6$). In either case, the W film has to have a low resistivity in order to use the W film as a gate electrode. A desirable resistivity of the W film is 20 μΩcm or lower. The resistivity of the W film can be reduced by increasing the crystal grain size but, if there are too many impurity elements such as oxygen in the W film, crystallization is inhibited to raise the resistivity. Accordingly, when the W film is formed by sputtering, a W target with a purity of 99.9999% is used and a great care is taken not to allow impurities in the air to mix in the W film being formed. As a result, the W film can have a resistivity of 9 to 20 μΩcm.

Although the first conductive film 5007 is a Ta film and the second conductive film 5008 is a W film in this embodiment, there is no particular limitation. The conductive films may be formed of any element selected from a group consisting of Ta, W, Mo, Al, and Cu, or of an alloy material or compound material mainly containing the elements listed above. A semiconductor film, typically a polycrystalline silicon film doped with an impurity element such as phosphorus, may be used instead. Other desirable combinations of materials for the first and second conductive films than the one shown in this embodiment include: tantalum nitride (TaN) for the first conductive film 5007 and W for the second conductive film 5008; tantalum nitride (TaN) for the first conductive film 5007 and Al for the second conductive film 5008; and tantalum nitride (TaN) for the first conductive film 5007 and Cu for the second conductive film 5008.

Next, a resist mask 5009 is formed to carry out first etching treatment for forming electrodes and wiring lines. In this embodiment, ICP (inductively coupled plasma) etching is employed in which CF$_4$ and Cl$_2$ are mixed as etching gas and an RF (13.56 MH$_z$) power of 500 W is given to a coiled electrode at a pressure of 1 Pa to generate plasma. The substrate side (sample stage) also receives an RF (13.56 MH$_z$) power of 100 W so that a substantially negative self-bias voltage is applied. When the mixture of CF$_4$ and Cl$_2$ is used, the W film and the Ta film are etched to the same degree.

Under the above etching conditions, if the resist mask is properly shaped, the first conductive film and the second conductive film are tapered around the edges by the effect of the bias voltage applied to the substrate side. The angle of the tapered portions is 15° to 45°. In order to etch the conductive films without leaving any residue on the gate insulating film, the etching time is prolonged by about 10 to 20%. The selective ratio of the W film to the silicon oxynitride film is 2 to 4 (typically 3), and therefore a region where the silicon oxynitride film is exposed is etched by about 20 to 50 nm by the over-etching treatment. In this way, first shape conductive layers 5010 to 5013 comprising first conductive layers 5010a to 5013a and second conductive layers 5010b to 5013b are formed from the first conductive film and the second conductive film through the first etching treatment. At this point, regions of the gate insulating film 5006 that are not covered with the first shape conductive layers 5010 to 5013 are etched and thinned by about 20 to 50 nm. (FIG. 7B)

Figure 7B:
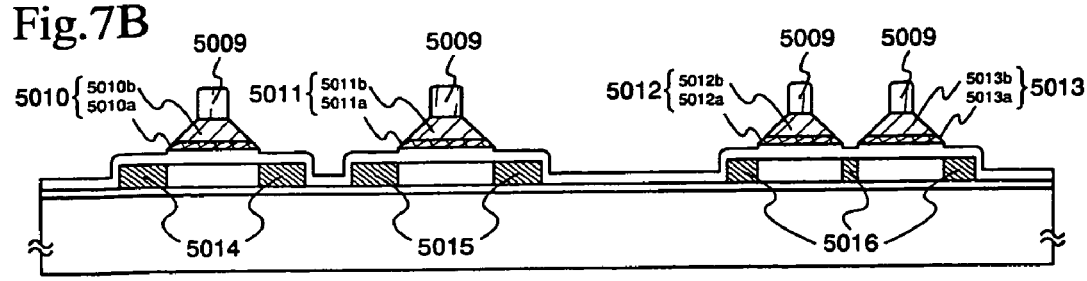

First doping treatment is conducted next for doping of an impurity element that gives the N-type conductivity (FIG. 7B). Ion doping or ion implanting is employed. In ion doping, the dose is set to $1 \times 10^{13}$ to $5 \times 10^{14}$ atoms/cm$^2$ and the acceleration voltage is set to 60 to 100 keV. The impurity element that gives the N-type conductivity is an element belonging to Group 15, typically, phosphorus (P) or arsenic (As). Here, phosphorus (P) is used. In this case, the conductive layers 5010 to 5013 serve as masks against the impurity element that gives the N-type conductivity, and first impurity regions 5014 to 5016 are formed in a self-aligning manner. The first impurity regions 5014 to 5016 each contain the impurity element that gives the N-type conductivity in a concentration of $1 \times 10^{20}$ to $1 \times 10^{21}$ atoms/cm$^3$.

Figure 7C:
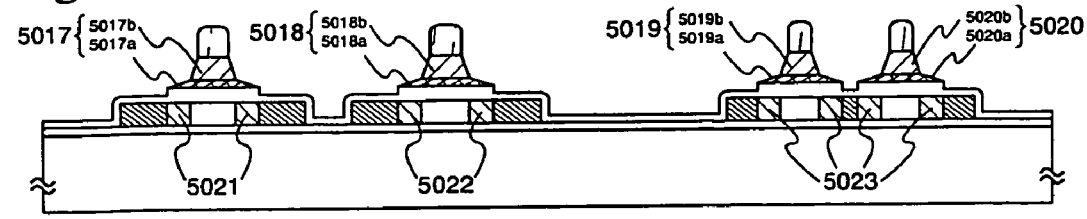

Next, as shown in FIG. 7C, a second etching process is performed. The ICP etching method is similarly used in which $CF_4$, $Cl_2$, and $O_2$ are mixed as the etching gases, and an RF power of 500 W is applied to a coil type electrode under a pressure of 1 Pa to generate plasma. An RF power of 50 W is applied to the side of the substrate (sample stage), and a low self bias voltage as compared with the first etching process is applied thereto. In accordance with the conditions, the W film as the second conductive layer is anisotropically etched, and the Ta film as the first conductive layer is anisotropically etched at an etching rate lower than the W film to form second shape conductive layers 5017 to 5020 (first conductive layers 5017a to 5020a and second conductive layers 5017b to 5020b). Reference numeral 5006 designates a gate insulating film, and regions which are not covered with the second shape conductive layers 5017 to 5020 are etched into a film thickness of about 20 to 50 nm, to for thin regions.

The reaction of the W film and the Ta film to etching by the mixture gas of $CF_4$ and $Cl_2$ can be deduced from the vapor pressure of radical or ion species generated and of reaction products. Comparing the vapor pressure among fluorides and chlorides of W and Ta, $WF_6$ that is a fluoride of W has an extremely high vapor pressure while the others, namely, $WCl_5$, $TaF_5$, and $TaCl_5$ have a vapor pressure of about the same degree. Accordingly, the W film and the Ta film are both etched with the mixture gas of $CF_4$ and $Cl_2$. However, when an appropriate amount of $O_2$ is added to this mixture gas, $CF_4$ and $O_2$ react to each other to be changed into CO and F, generating a large amount of F radicals or F ions. As a result, the W film whose fluoride has a high vapor pressure is etched at an increased etching rate. On the other hand, the etching rate of the Ta film is not increased much when F ions are increased in number. Since Ta is more easily oxidized than W, the addition of $O_2$ results in oxidization of the surface of the Ta film. The oxide of Ta does not react with fluorine or chlorine and therefore the etching rate of the Ta film is reduced further. Thus a difference in etching rate is introduced between the W film and the Ta film, so that the etching rate of the W film is set faster than the etching rate of the Ta film.

Then second doping treatment is conducted (FIG. 7C). In the second doping treatment, the film is doped with an impurity element that gives the N-type conductivity in a dose smaller than in the first doping treatment and at a high acceleration voltage. For example, the acceleration voltage is set to 70 to 120 keV and the dose is set to $1 \times 10^{13}$ atoms/cm$^2$ to form new impurity regions inside the first impurity regions that are formed in the island-like semiconductor layers in FIG. 7B. While the second conductive layers 5017b to 5020b are used as masks against the impurity element, regions under the first conductive layers 5017a to 5020a are also doped with the impurity element. Thus formed are second impurity regions 5021 to 5023 overlapping the first conductive layer.

Figure 8A:
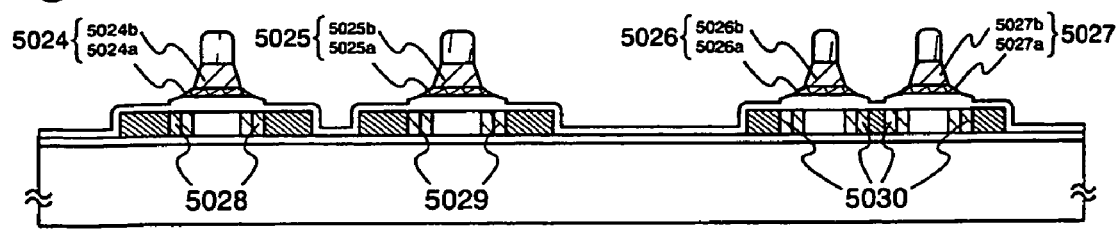
FIGS. 8A to 8C are diagrams showing the example of a process of manufacturing a display device.

Next, as shown in FIG. 8A, a third etching process is performed. In this embodiment, an ICP etching device is employed and $Cl_2$ is used as etching gas. Etching is conducted for 70 seconds, setting the flow rate of $Cl_2$ to 60 (sccm), and an RF power of 350 W is applied to a coil type electrode under a pressure of 1 Pa to generate plasma. An RF power is also applied to the side of the substrate (sample stage) so that a substantially negative self-bias voltage is applied. Through the third etching process, the first conductive layer is etched to reduce the region, thereby third shape conductive layers 5024 to 5027 (first conductive layers 5024a to 5027a and second conductive layers 5024b to 5027b) are formed. A portion of the second impurity regions 5021 to 5023 include the third impurity regions 5028 to 5030 that are not covered with the first conductive layer.

Through the steps above, the impurity regions are formed in the respective island-like semiconductor layers. The third shape conductive layers 5024 to 5027 overlapping the island-like semiconductor layers function as gate electrodes of TFTs.

The impurity elements used to dope the island-like semiconductor layers in order to control the conductivity types are activated. The activation step is carried out by thermal annealing using an annealing furnace. Other activation adoptable methods include laser annealing and rapid thermal annealing (RTA). The thermal annealing is conducted in a nitrogen atmosphere with an oxygen concentration of 1 ppm or less, preferably 0.1 ppm or less, at 400 to 700° C., typically 500 to 600° C. In this embodiment, the substrate is subjected to heat treatment at 500° C. for four hours. However, if the wiring line material used for the third shape conductive layers 5024 to 5027 are weak against heat, the activation is desirably made after an interlayer insulating film (mainly containing silicon) is formed in order to protect the wiring lines and others.

Another heat treatment is conducted in an atmosphere containing 3 to 100% hydrogen at 300 to 450° C. for one to twelve hours, thereby hydrogenating the island-like semiconductor layers. The hydrogenation steps are to terminate dangling bonds in the semiconductor layers using thermally excited hydrogen. Alternatively, plasma hydrogenation (using hydrogen that is excited by plasma) may be employed.

Figure 8B:
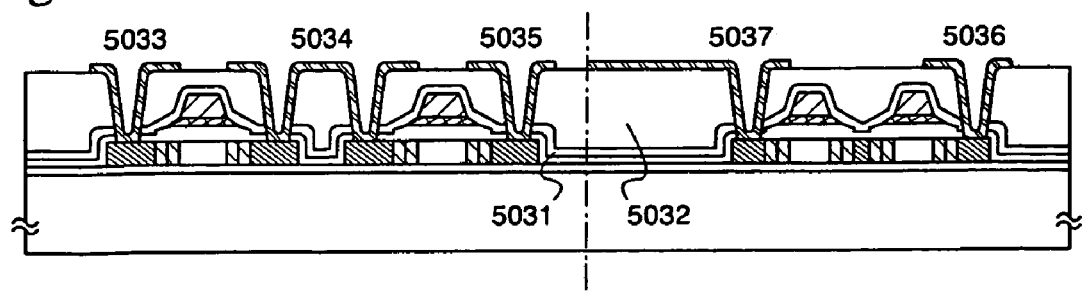

As shown in FIG. 8B, a first interlayer insulating film 5031 is formed next from a silicon oxynitride film with a thickness of 100 to 200 nm. A second interlayer insulating film 5032 is formed thereon from an organic insulating material. Thereafter, contact holes are formed corresponding to the first interlayer insulating film 5031, the second interlayer insulating film 5032, and the gate insulating film 5006. A film made of-wiring lines material is formed, whereby connection wiring lines 5033 to 5036 and a pixel electrode 5037 are formed by patterning.

The second interlayer insulating film 5032 is a film made of an organic resin. Examples of the usable organic resin includes polyimide, polyamide, acrylic resin, and BCB (benzocyclobutene). Since planarization is a significant aspect of the role of the second interlayer insulating film 5032, acrylic resin that can level the surface well is particularly preferable. In this embodiment, the acrylic film is thick enough to eliminate the level differences caused by the TFTs. An appropriate thickness of the film is 1 to 5 μm (preferably 2 to 4 μm).

The contact holes are formed by dry etching or wet etching, and include contact holes reaching the impurity regions 5014 to 5016 having the N-type conductivity, the source signal lines, the gate signal lines (not shown), power supply lines (not shown), and gate electrodes 5024 to 5026 (not shown) respectively.

Further, a lamination film of a three layer structure, in which a 100 nm thick Ti film, a 300 nm thick Al film containing Ti, and a 150 nm thick Ti film are formed in succession by sputtering wirings 5033 to 5036. Of course, other conductive films may be used. As to the pixel electrode 5037, in a case of that the display device is a reflect type, is formed by a material in high reflectivity. On the other hand, in a case of that the display device is a transmission type, the pixel electrode 5037 is formed by using a material like Indium Tin Oxide (ITO) or the like that has transparent conductivity.

An opposing substrate 5038 is prepared next. A light shielding film is formed on the opposing substrate 5038. The light shielding film is formed of a material such as chrome (Cr) into a thickness of 100 to 200 nm.

On the other side, an opposing electrode 5040 is formed in the pixel portion. The opposing electrode is formed by using a transparent conductive material such as ITO. Further, it is preferable that the film thickness of the opposing electrode be from 100 to 120 nm in order to maintain a high transmittivity of visible light.

Orientation films 5041 and 5042 are formed in the active matrix substrate and the opposing substrate. It is preferable that the film thickness of the orientation films 5041 and 5042 be from 30 to 80 nm. Furthermore, materials such as SE7792, for example, manufactured by Nissan Chemical Industries, Ltd., can be used for the orientation films. If an orientation film having a high pre-tilt angle is used, then the generation of disclination can be controlled at the same time as driving the liquid crystal display device by an active matrix method.

The orientation films 5041 and 5042 undergo a rubbing process next. It is preferable that the rubbing direction show a counterclockwise TN (twisted nematic) orientation when the liquid crystal display device is complete.

Although not shown in particular in the figures for Embodiment 2, it is also possible to increase the uniformity of a cell gap by distributing spacers within the pixels or by patterning. A photosensitive resin film is formed and patterned in Embodiment 2, thus forming spacers having a height of 4.0 μm.

The active matrix substrate and the opposing substrate are then bonded by using a sealant 5043. The thermosetting sealant XN-21S manufactured by Mitsui Chemicals is used as the sealant. A filler is mixed into the sealant. Note that the height of the filler is set to 4.0 μm. After the sealant is hardened, the active matrix substrate and the opposing substrate are sectioned simultaneously into predetermined sizes.

Liquid crystals 5044 are injected next. Considering high speed response characteristics and the like, it is preferable to use a low viscosity liquid crystal material for the liquid crystals. A nematic liquid crystal material having an easily controlled orientation is used in Embodiment 2. High response speed ferroelectric liquid crystals and anti-ferroelectric liquid crystals may of course also be used.

Figure 8C:
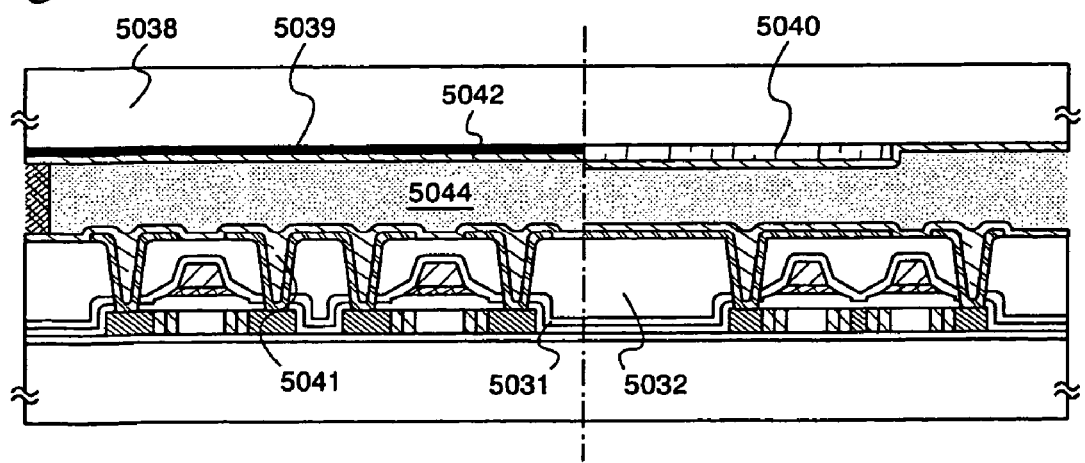

In injection port is sealed by using a UV hardening resin or the like after liquid crystal injection is complete. A polarizing sheet is then attached by a known method. Lastly, a connector (flexible printed circuit: FCP) for connecting the elements formed on the substrate, or terminals pulled out from the circuits with external signal terminals is attached, completing a manufactured product (see FIG. 8C). This state, one capable of being shipped as a finished product, is referred to as a liquid crystal display device within this specification.

Further, the number of photomasks necessary for manufacturing the active matrix substrate can be kept to four (island shape semiconductor layer pattern, first wiring pattern (gate wirings, island shape source wirings, capacitor wirings), contact hole pattern, and second wiring pattern (including pixel electrodes and connection electrodes)) in accordance with the processes disclosed in Embodiment 2. As a result, processing can be shortened, and this contributes to a reduction in manufacturing costs and to an increase in yield.

Embodiment 3

An example of manufacturing a display device which has the circuit as shown in the Embodiment Mode and Embodiment 1 is discussed in Embodiment 3.

Figure 10A:
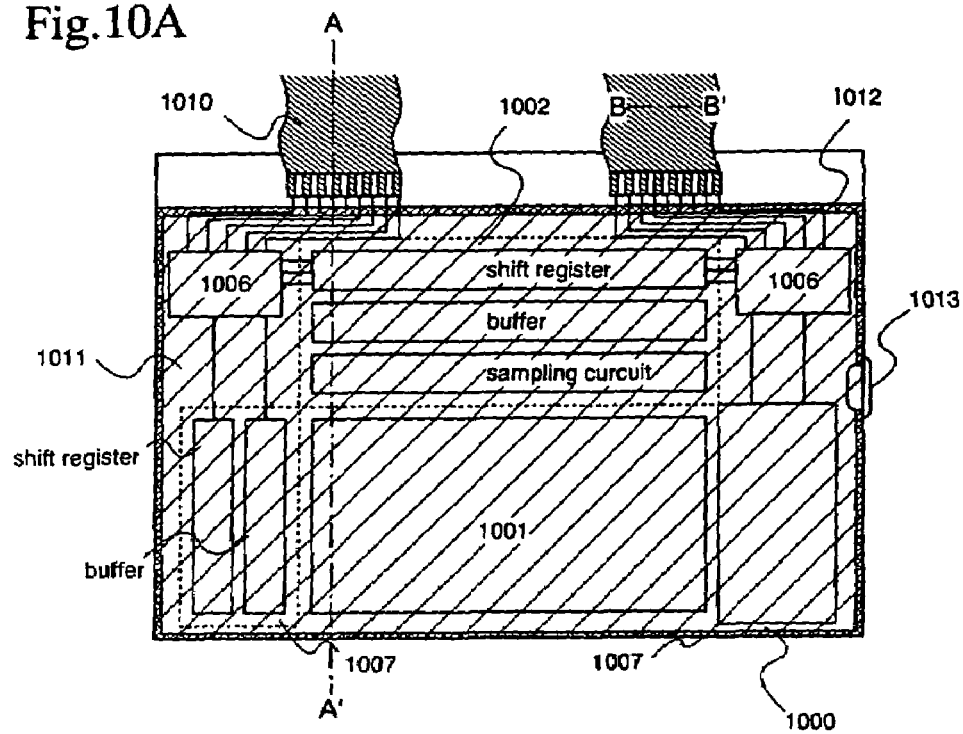
FIGS. 10A to 10C are schematic and cross sectional diagrams of a display device.

A schematic diagram of the display device is shown in FIG. 10A. A pixel portion 1001 is placed in a center portion of a substrate 1000. A source signal line driver circuit 1002 for controlling source signal lines, and gate signal line driver circuits 1007 for controlling gate signal lines are formed in the periphery of the pixel portion 1001. Although the gate signal line driver circuits 1007 are placed symmetrically on both side of the pixel portion 1001, there may be a gate signal driver circuit formed on only one side thereof.

Signals input from the outside for driving the source signal line driver circuit 1002 and the gate signal line driver circuits 1007 are input through an FPC 1010. The signals input from the FPC 1010 have small voltage amplitudes, and therefore undergo transformation of the voltage amplitudes by level shifters 1006, and then, are input to the source signal line driver circuit 1002 and the gate signal line driver circuits 1007 in Embodiment 3.

Figure 10B:
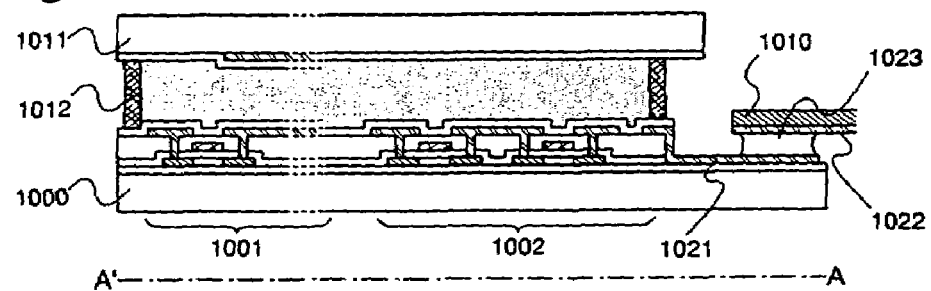

FIG. 10B illustrates a cross section taken along line A–A' of FIG. 10A. The pixel portion 1001, the source signal line driver circuit 1002, the gate signal drive circuit(not shown) are formed on the substrate 1000. The substrate 1000 and a counter substrate 1011 are attached each other by a sealant 1002, liquid crystals are injected in the gap between the substrates. As shown in FIG. 10A, the injection entrance is sealed by a sealant 1013 thereafter.

Figure 10C:
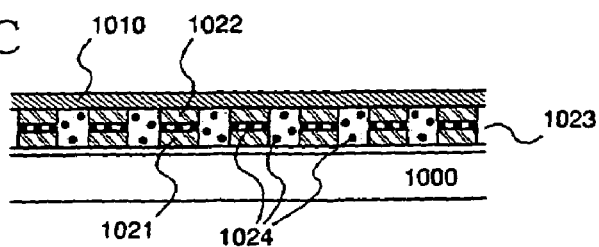
Figure 12A:
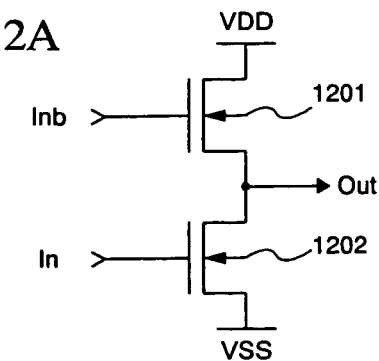
FIGS. 12A to 12C are diagrams showing inverter operation by single polarity TFTs.
Figure 12B:
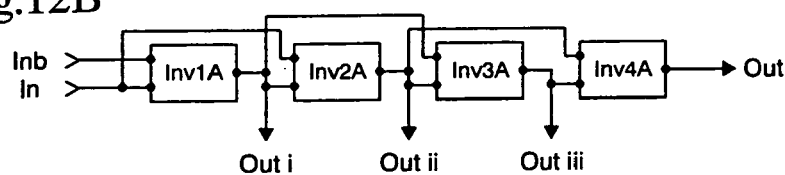
Figure 12C:
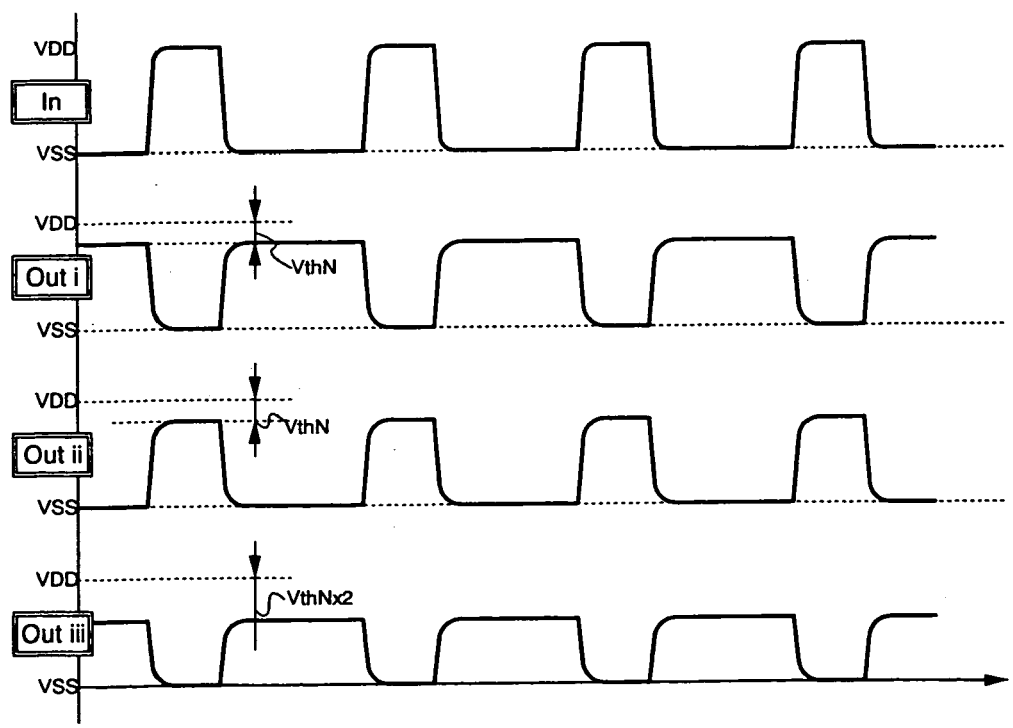

A lead-out wiring 1021 is electrically connected to an FPC side wiring 1022 of an FPC 1010 through an anisotropic conductive film 1023. Further, as shown in FIG. 10C, the anisotropic conductive film 1023 has conductive filler 1024. The lead-out wiring 1021 on the substrate 1000 and the FPC side wiring 1022 on the FPC 1010 are electrically connected to each other through the conductive filler 1024 by heat-pressing the substrate 1000 and the FPC 1010.

Figure 3:
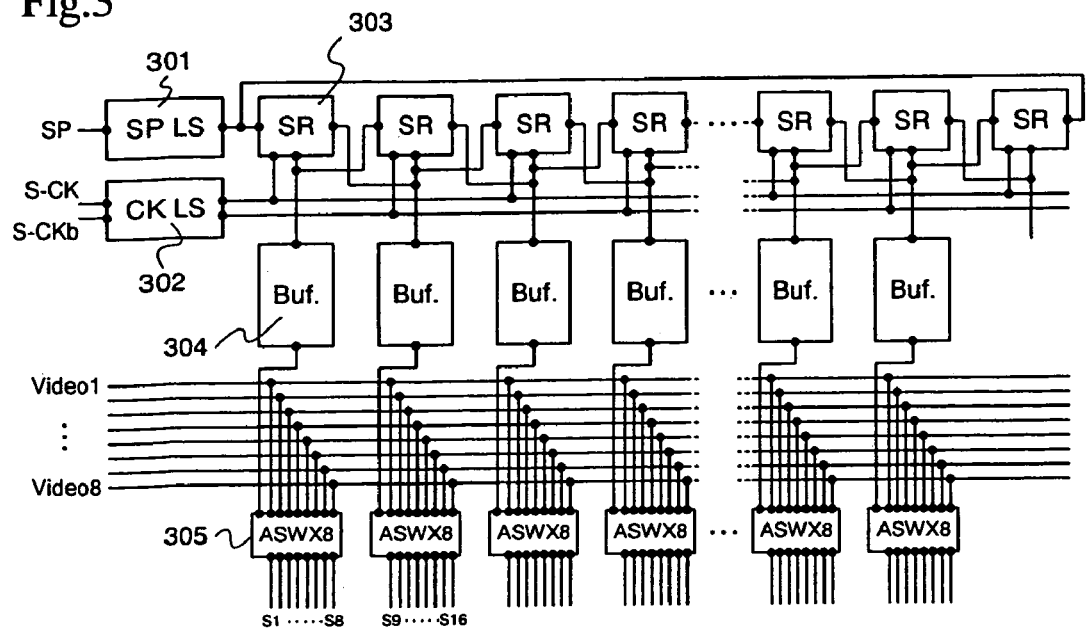
FIG. 3 is a diagram showing the structure of a source signal line driver circuit used in a display device manufactured by an embodiment.

FIG. 3 is a diagram showing the structure of the source signal line driver circuit. The source signal line driver circuit has level shifters 301, 302, shift registers 303, buffers 304, sampling circuits 305.

A source side clock signal (S-CK), a source side clock inverted signal (S-CKb), a source side start pulse (S-SP), analog image signals (Video 1–8) are input to the source signal line driver circuit. Among these signals, the clock signal and the start pulse are input after undergoing amplitude transformation by the level shifters 301 and 302. Note that although the analog image signals divided into 8 divisions are input in Embodiment 3, substantially there is no limitation when the display device is manufactured.

Figure 4A:
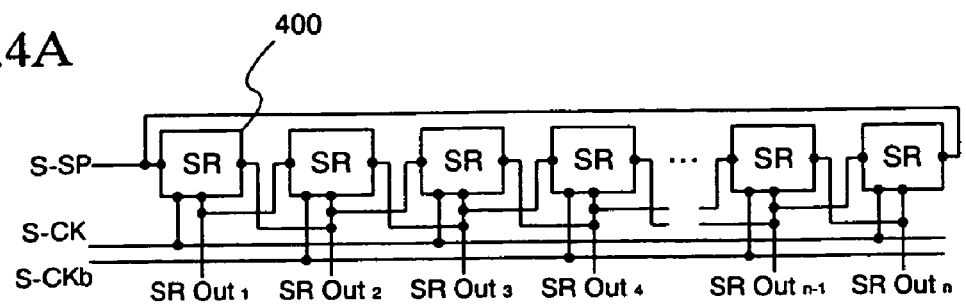
FIGS. 4A and 4B are diagrams showing the structure of a shift register used in a display device manufactured by an embodiment.
Figure 4B:
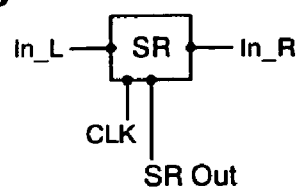
Figure 4B:
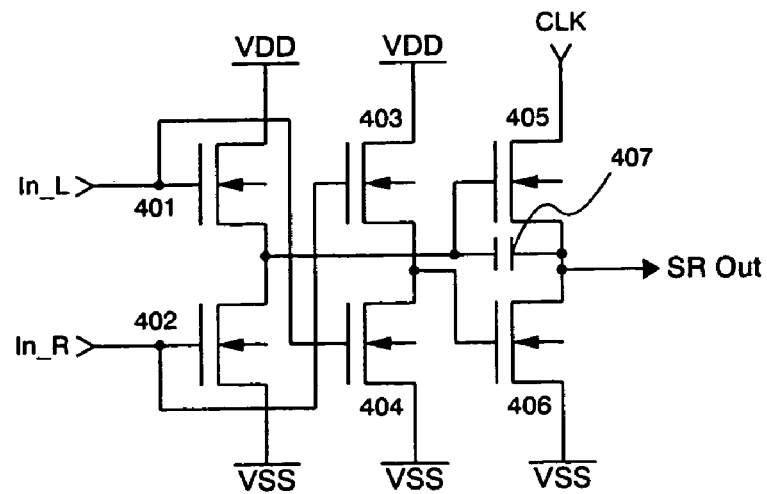

The structure of the shift registers is shown in FIG. 4. A block denoted by reference numeral 400 in a block diagram of FIG. 4A is a pulse output circuit for outputting one stage portion of sampling pulses. Shift registers of FIG. 4A are structured by n stages (where n is a natural number, 1<n) of pulse output circuits.

FIG. 4B is a diagram showing the structure of the pulse output circuit in detail. The pulse output circuit body is composed of TFTs 401 to 406, and a capacitor 407. In the k-th stage pulse output circuit (where k is a natural number, 1<k<n), output pulses from the (k−1)-th stage pulse output circuit are input to gate electrodes of the TFTs 401 and 404, while output pulses from the (k+1)-th stage pulse output circuit are input to gate electrodes of the TFTs 402 and 403, respectively. Note that start pulses (SP) are input to the gate electrodes of the TFTs 401 and 404 when k=1, namely in the initial stage pulse output circuit, and that start pulses (SP) are input to the gate electrodes of the TFTs 402 and 403 when k=n, namely in the final stage pulse output circuit.

Figure 14:
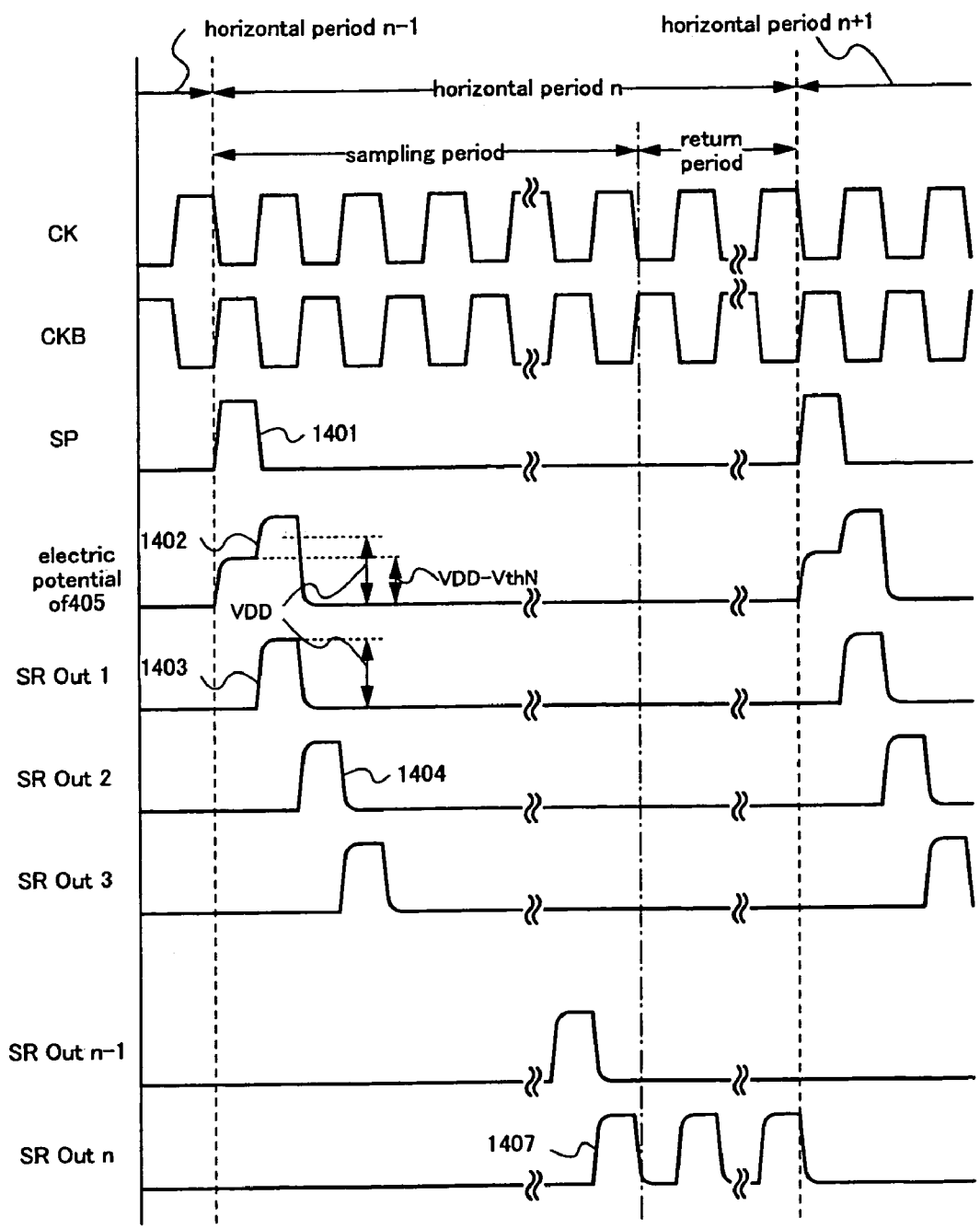
FIG. 14 is a diagram for explaining operational timing for a shift register.

Circuit operation is explained in detail here with reference to the timing chart shown in FIG. 14. In the k-th stage pulse output circuit, the output pulse from the (k−1)-th stage pulse output circuit is input to the gate electrodes of the TFTs 401 and 404 to become H level (a start pulses is input if k=1, namely for the initial stage), and the TFTs 401 and 404 turn on (refer to FIG. 14, reference numeral 1401). The electric potential of a gate electrode of the TFT 405 is pulled up to the VDD side (FIG. 14, reference numeral 1402), and the TFT 401 turns off to the gate electrode of the TFT 405 placed in a floating state when the electric potential becomes VDD−VthN. The voltage between a gate and a source of the TFT 405 is greater than the threshold value at this point, and the TFT 405 turns on. On the other hand, pulses are not input to the gate electrodes of the TFTs 402 and 403 to remain at L level and the TFTs 402 and 403 are therefore in an off state. The electric potential of a gate electrode of the TFT 406 is therefore L level to be turned off. The electric potential of an output terminal (SR out) of the pulse output circuit is thus pulled up to the VDD side in accordance with the clock signal becoming H level (S-CK or S-CKb) input to an input electrode of the TFT 405 (FIG. 14, reference numeral 1403). In this state, however, the electric potential of the output terminal (SR out) of the pulse output circuit drops further by the threshold value with respect to the electric potential (VDD−VthN) of the gate electrode of the TFT 405, and only an increase to [VDD−2(VthN)] is obtained.

The capacitor 407 is formed between the gate electrode and the output electrode of the TFT 405 here, and in addition, the gate electrode of the TFT 405 is in a floating state. The electric potential of the gate electrode of the TFT 405 is therefore further pulled up from (VDD−VthN) by the capacitor 407 in accordance with the rise in the electric potential of the output terminal (SR out) of the pulse output circuit, namely the rise in the electric potential of the output electrode of the TFT 405. In accordance with this operation, the final electric potential of the gate electrode of the TFT 405 becomes higher than (VDD+VthN) (FIG. 14, reference numeral 1402). The electric potential of the output terminal (SR out) of the pulse output circuit is not influenced by the threshold value of the TFT 405, and increases normally to VDD (FIG. 14, reference numeral 1403).

Similarly a pulse is output from the (k+1)-th stage pulse output circuit (FIG. 14, reference numeral 1404). The output pulse of the (k+1)-th stage is returned to the k-th stage and is input to the gate electrodes of the TFTs 402 and 403. The electric potentials of the gate electrodes of the TFTs 402 and 403 become H level, and the TFTs 402 and 403 turn on. The electric potential of the gate electrode of the TFT 405 is pulled down to the VSS side, and the TFT 405 turns off. Simultaneously, the electric potential of the gate electrode of the TFT 406 becomes H level, and the TFT 406 turns on. The electric potential of the output terminal (SR out) of the k-stage pulse output circuit becomes L level.

Pulses with the amplitude between VDD−VSS are then output one after another by similar operations up through the final stage. Circuit operation is also similar for reverse direction scanning.

In the final stage, a pulse is not returned from the next stage, and therefore the clock signal continues to be output through the TFT 405 (FIG. 14, reference numeral 1407). The output pulses from the pulse output circuit of the final stage therefore cannot be used as sampling pulses. Similarly, the output pulses from the initial stage are final output pulses in the case of the reverse direction scanning, and therefore cannot be used as sampling pulses. In the circuit shown in Embodiment 3, the shift register is therefore structured by pulse output circuits with two more stages than the necessary number of stages. The pulse output circuits at both ends are handled as dummy stages. Even so, it is necessary to stop the final output by some method before the next horizontal period begins, and therefore the final output is stopped at the point where the start pulse for the next horizontal period is input by using the start pulse as the input for the initial stage and the period input for the final stage period.

Figure 5A:

FIG. 5 shows the structure of the buffers 304. As shown in FIG. 5A, this is a structure having four stages. Only the first stage is a single input, single output type (Buf Unit 1) 501. The second and subsequent stages are two input, two output types (Buf Unit 2) 502.

The circuit structure of the initial stage unit (Buf Unit 1) is shown in FIG. 5B. Signals are input to gate electrodes of TFTs 552, 554 and 556. A gate electrode of a TFT 551 is connected to an input electrode. When H level is input to the gate electrodes of the TFTs 552, 554 and 556 to become in an on state, then the electric potential of gate electrodes of TFTs 553 and 555 become L level, and as a result, an output terminal (out) becomes L level. When L level is input to the gate electrodes of the TFTs 552, 554 and 556, the TFTs 552, 554 and 556 turn off. Since the gate electrode and an input electrode of the TFT 551 are connected and the TFT 551 is normally on, the electric potential of the gate electrodes of the TFT 553 and 555 increase. Similarly to the case of the above-stated shift register, there is capacitive coupling due to a capacitor 557, and the output therefore becomes H level. When the signals input from an input terminal (In) change from H level to L level, the capacitor 558 is used to reduce the electric potential of the output electrode of the TFT 553 once, as described in the Embodiment Mode.

Note that the relationship between the TFT 551 and the TFT 552 is as follows: the gate electrode and the input electrode of the TFT 551 are connected, and therefore both the TFT 551 and the TFT 552 are in an on state when the TFT 552 turns on. It is necessary for the electric potential of the gate electrodes of the TFT 553 and 555 to become L level in this state, and therefore it is necessary to design the channel width of the TFT 551 to be smaller than that of the TFT 552. It is sufficient to have the capability for charging the gate electrodes of the TFT 553 and 555, and therefore the channel width of the TFT 551 may be set to a minimum value. Furthermore, it is possible to obtain no increase in electric current consumption in a period during which the TFT 552 is on, due to the penetration path among power supply VDD, the TFT 551, the TFT 552, and power supply VSS, by making the TFT 551 smaller.

FIG. 5C shows the structure of the unit (Buf Unit 2) used in the second and later stages. Input to the gate electrode of the TFT 562 is similar to that of the initial stage, and in addition, the previous stage input is used as an inverted input to the gate electrode of the TFT 561. The TFTs 561 and 562 are thus exclusively on and off, respectively, and the penetration path among power supply VDD, the TFT 561, the TFT 562, and power supply VSS can be eliminated in the structure of FIG. 5B.

FIG. 6 shows structures of a clock signal level shifter (CKLS) and a start pulse level shifter (SPLS) used in the display device of Embodiment 3. The basic structure has four stages, a level shifter for an initial stage, and buffers for the second and the following stages, which are similar to the aforementioned buffer circuits. A signal with the amplitude of VDD$_{LO}$–VSS is input, and an output signal with amplitude of VDD–VSS is obtained (where |VDD$_{LO}$|<|VDD| here).

Regarding the clock signal level shifter, the initial stage is a one input, one output type, while the second and the subsequent stages are two input, one output types. The mutual inputs are also used as inverted inputs.

The start pulse level shifter has a similar structure to that of the aforementioned buffer.

Figure 6A:
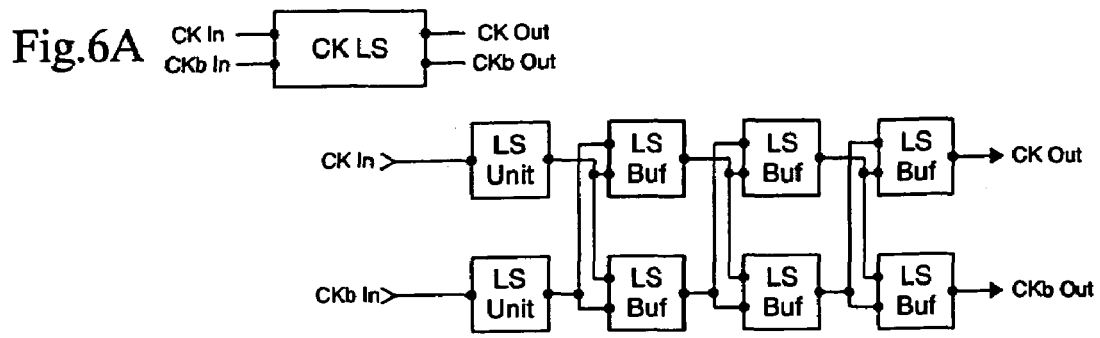
FIGS. 6A to 6D are diagrams showing the structure of a level shifter used in a display device manufactured by an embodiment.
Figure 6B:
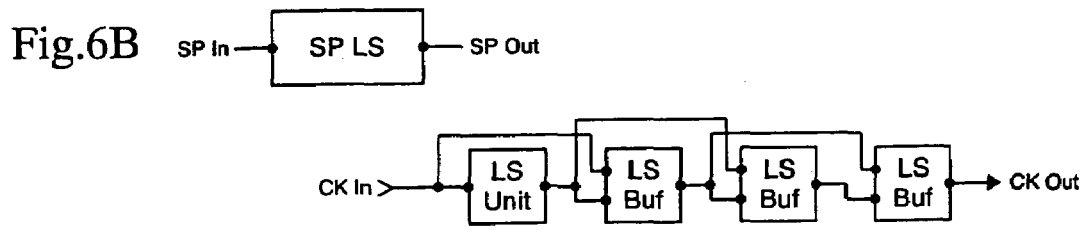
Figure 6C:
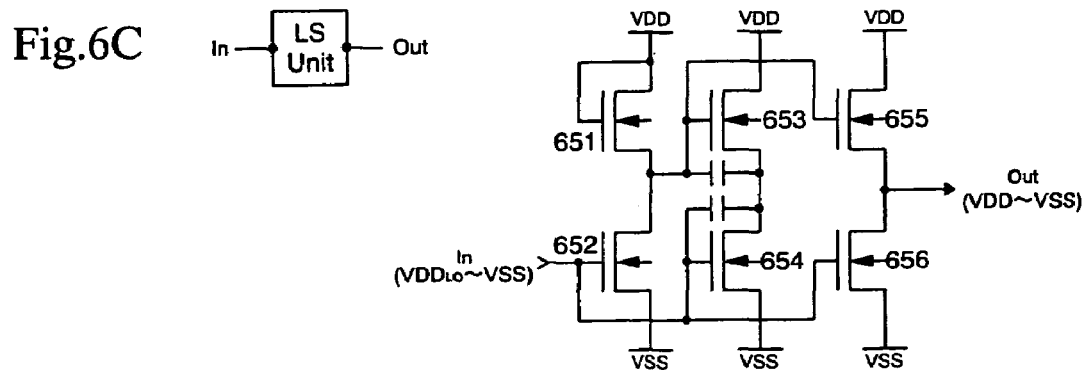
Figure 6D:
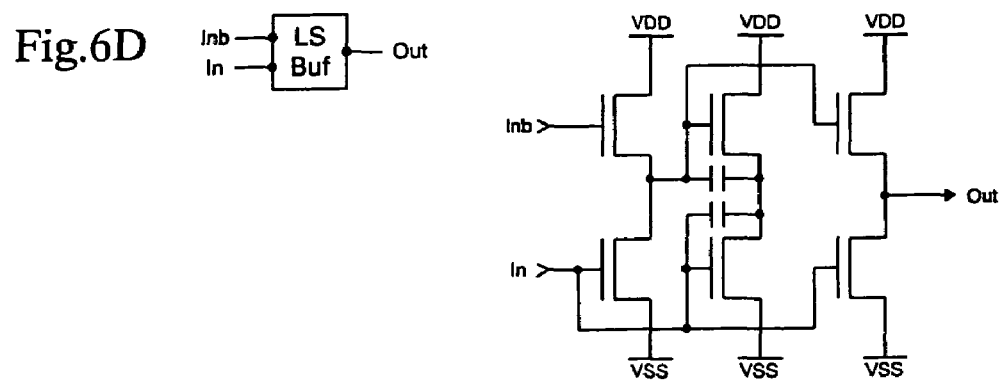

The circuit structure of the unit used for the initial stage of the level shifter is shown in FIG. 6C, while the circuit structure the unit used for the second and the subsequent stages is shown in FIG. 6D. The circuit structure and operation are similar to those shown in FIGS. 5B and 5C, respectively. The only difference is that the amplitude of the signal input in the initial stage is VDD$_{LO}$–VSS.

The TFT 652, 654, 656 turn on when the H level signal is input from an input terminal (IN) (in the case in which the absolute value |VDD$_{LO}$–VSS| of the amplitude of the input signal is certainly greater than the absolute value |VthN| of the threshold value of the TFT 652, 654, 656). The electric potential of gate electrodes of TFTs 653 and 654 is pulled down to the VSS side, and therefore L level appears at an output terminal (out). On the other hand, when the signal input to the gate electrode of the TFT 652 is L level, then the TFTs 652, 654, and 656 turn off, and the electric potential of the gate electrodes of the TFT 653 and 655 is pulled up to the VDD side, through the TFT 651. Subsequent operations are similar to those of the aforementioned buffer.

This level shifter with the above structure has a characteristic that the input signal is not directly input to the gate electrode for controlling the TFT 651 connected to the high electric potential side (VDD side). Consequently, the electric potential of the gate electrodes of the TFTs 653 and 655 can be pulled up, no matter what the threshold value of the TFT 651 is, even if the amplitude of the input signal is small. A high amplitude transformation gain is therefore obtained.

Figure 15:
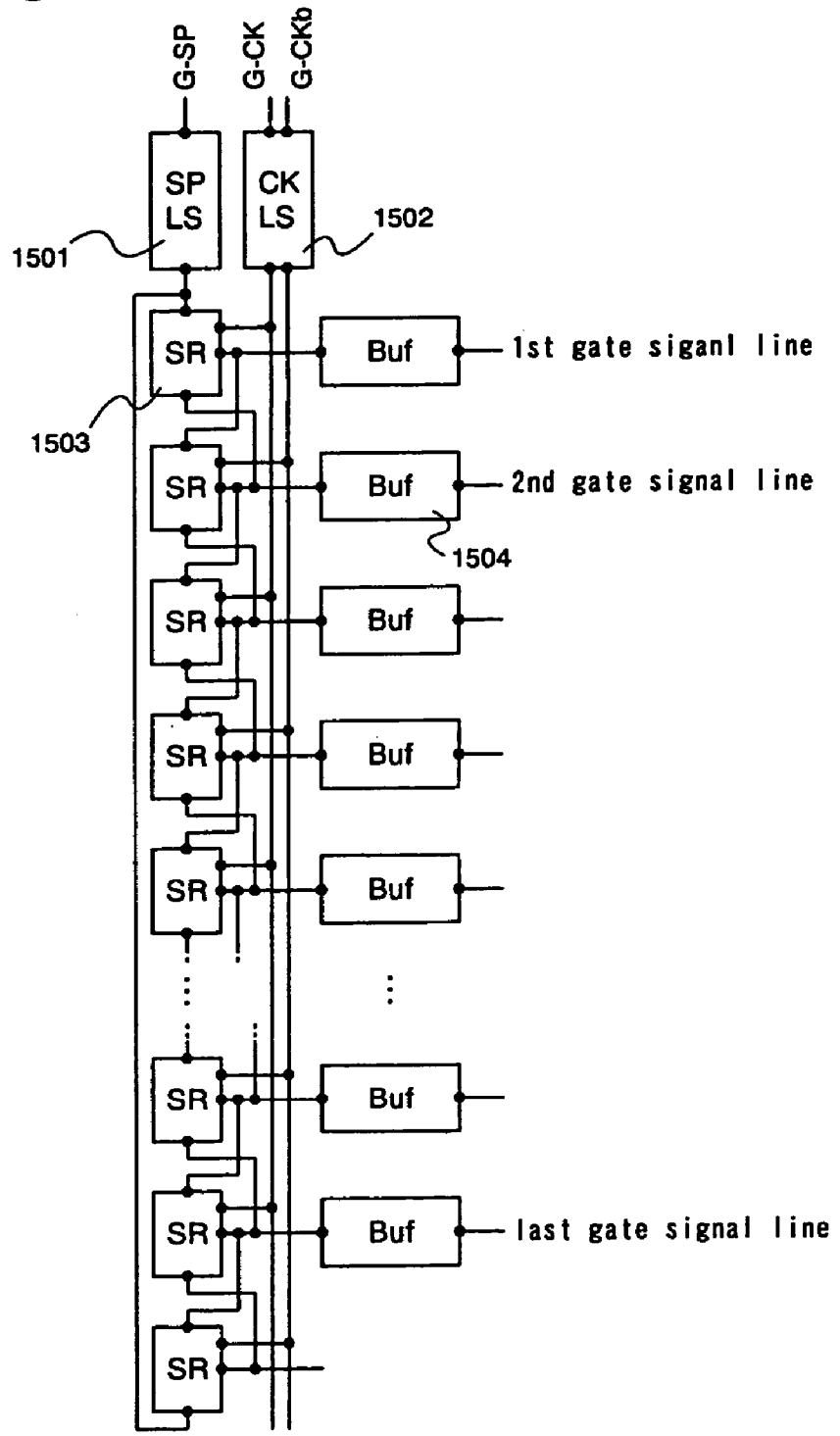
FIG. 15 is a diagram showing the structure of a gate signal line driver circuit used in a display device manufactured by an embodiment.

FIG. 15 is a diagram showing the circuit structure of a gate signal line driver circuit. The gate signal line driver circuit has a level shifter 1501 used for start pulse, a level shifter 1502 used for a clock signal, a shift register 1503 and a buffer 1504.

A gate side clock signal (G-CK), a gate side clock inverted signal (G-CKb), and a gate side start pulse (G-SP) are input to the gate signal line driver circuit. The input signals are input after undergoing amplitude transformation by level shifters 1501 and 1502.

Note that the shift register 1503, the buffer 1504, the start pulse level shifter 1501, and the clock signal level shifter 1502 are similar to those used in the source signal line driver circuit, and therefore an explanation of their structure and operation is omitted here.

The display device manufactured by using the driver circuit introduced here and pixels shown in Embodiment 2 is structured by only single polarity TFTs, and therefore a portion of a doping process during manufacturing can be eliminated. In addition, it becomes possible to reduce the number of photomasks. It is also possible to resolve the problem of an increase in current consumption due to an expanded signal amplitude by using circuits that apply the bootstrap method, as discussed above.

Embodiment 4

Although an example of a case in which the pixels and the driver circuits in the periphery are structured by using n-channel TFTs is explained in Embodiment 2, it is also possible to implement the present invention by using p-channel TFTs.

In the case of n-channel TFTs, impurity regions referred to as overlap regions are formed to overlap gate electrodes in order to control hot carrier degradation and the like. In contrast, there is little influence due to hot carrier degradation in the case of p-channel TFTs, and therefore it is not particularly necessary to form overlap regions. It is therefore possible to perform manufacturing by simpler process steps.

Figure 16A:
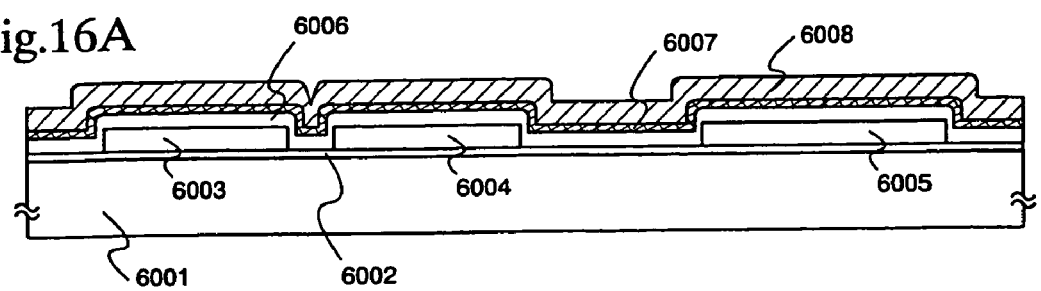
FIGS. 16A to 16C are diagrams showing an example of a process of manufacturing a display device.

A base film 6002 is formed on an insulating substrate 6001 1 such as glass, island-shaped semiconductor layers 6003 to 6005, a gate insulating film 6006, and conductive layers 6007 and 6008 are then formed as shown in FIG. 16A in accordance with Embodiment 2. Although The conductive layers 6007 and 6008 are shown here as a laminate structure, a single layer structure may also be used without any particular problems.

Figure 16B:
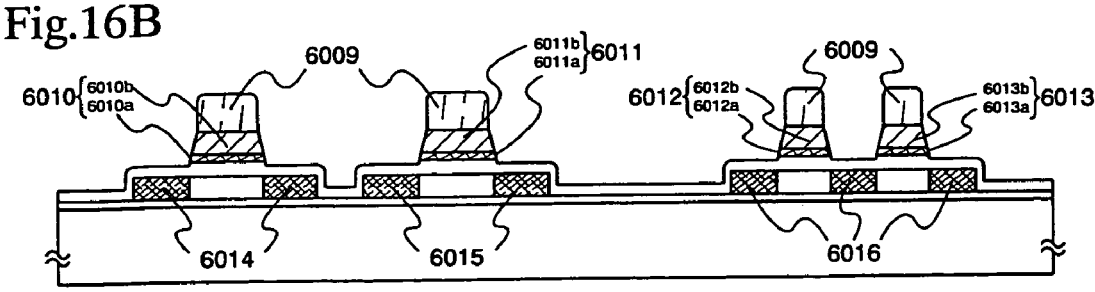

Next, as shown in FIG. 16B, a mask 6009 is formed from resist, and a first etching process is performed. Anisotropic etching is performed in Embodiment 2 by utilizing selectivity due to the materials of the conductive layers with the laminate structure. However, it is not particularly necessary to form regions that become overlap regions here, and therefore normal etching may be performed. A region that becomes thinner by an amount on the order of 20 to 50 nm due to etching at this point is formed in the gate insulating film 6006.

A first doping process for adding an impurity element that imparts p-type conductivity to the island shape semiconductor layers is performed next. Conductive layers 6010 to 6013 are used as masks against the impurity element, and the impurity regions 6014 to 6016 are formed in a self-aligning manner. Boron (B) and the like are typically used as the impurity element that imparts p-type conductivity. The impurity regions 6014 to 6016 are formed by ion doping using diborane (B$_2$H$_6$) here, and the impurity concentration within the semiconductor layers is set from $2\times10^{20}$ to $2\times10^{21}$ atoms/cm$^3$.

Figure 16C:
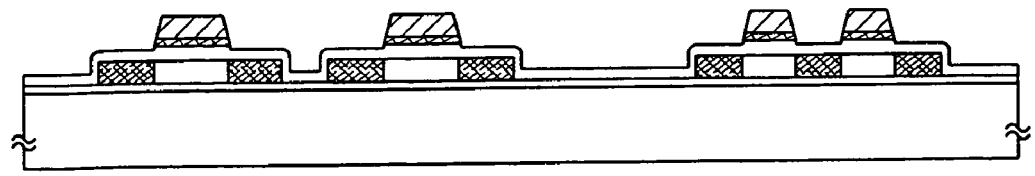

The resist mask is then removed, and the state of FIG. 16C is obtained. Manufacturing then continues in accordance with the steps from FIG. 8B onward in Embodiment 2.

Embodiment 5

Figure 18A:
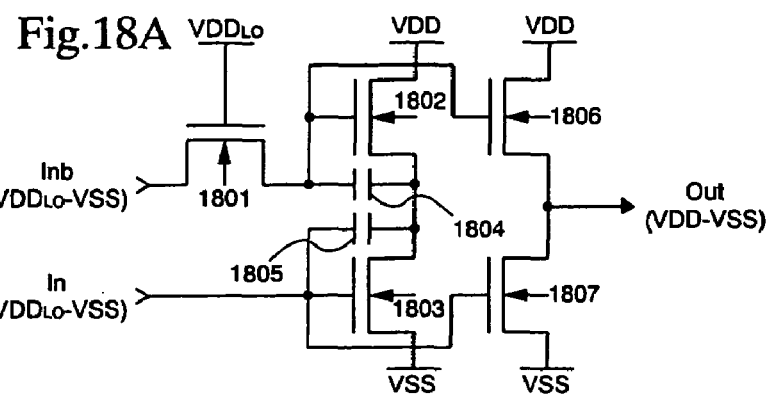
FIGS. 18A and 18B are diagrams showing an embodiment using a level shifter of the present invention.

Although a circuit shown in FIG. 18A has a similar structure to that of the inverter circuit shown in FIGS. 1A and 1B, electric potential applied to a gate electrode of a TFT 1801 is VDD$_{LO}$ (<VDD), and the amplitude of an input signal is from VDD$_{LO}$ to VSS.

Operation is now explained. The electric potential of gate electrodes of TFTs 1803 and 1807 becomes H level to turn the TFTs 1803 and 1807 on when the H level is input to a first signal input portion (In). At the same time, L level is input to a second signal input portion (Inb). VDD$_{LO}$ is input to the gate electrode of the TFT 1801 to turn the TFT 1801 on, and therefore the electric potential of gate electrodes of TFTs 1802 and 1806 becomes the L level to turn the TFTs 1802 and 1806 off. Thus, L level appears in a signal output portion (Out).

On the other hand, the electric potential of the gate electrodes of the TFTs 1803 and 1807 becomes the L level to turn the TFTs 1803 and 1807 off when the L level is input to the first signal input portion (In).

Figure 18B:
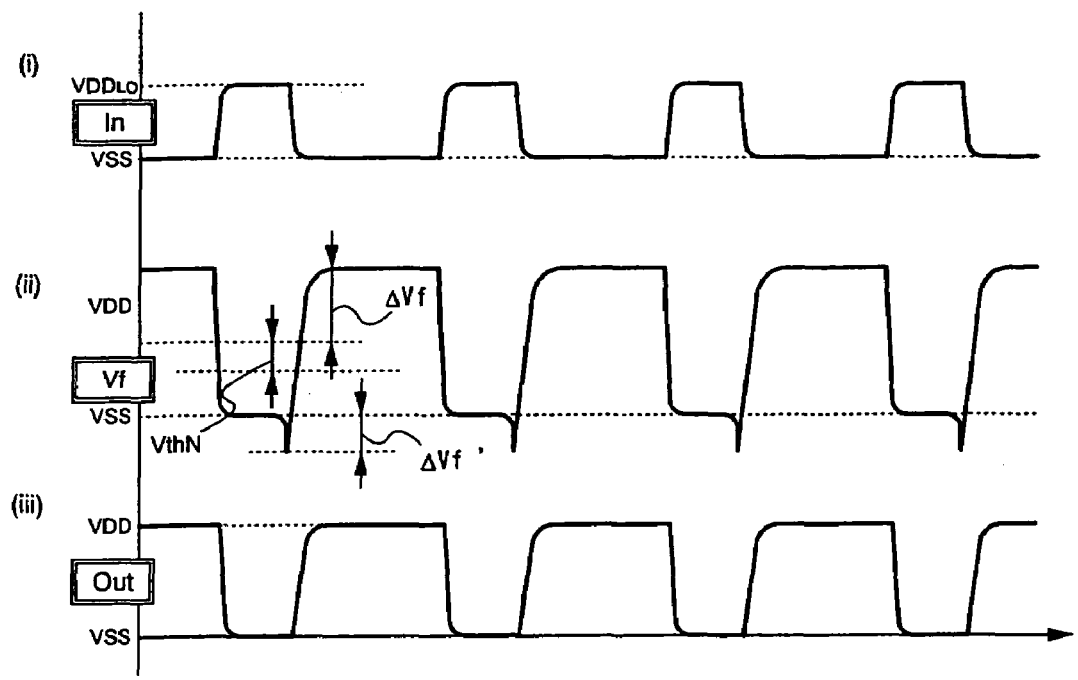

Operation at the instant that the signal input to the first signal input portion (In) switches from the H level to the L level is explained here. The electric potential of the signal input to the first signal input portion (In) begins to fall from the H level, and the voltage between a gate and a source of the TFT 1803 and the voltage between a gate and a source of the TFT 1807 soon fall below the threshold value of the TFTs 1803 and 1807 to turn them off. At this time, output terminals of the TFTs 1803 and 1807 are placed in a floating state. In addition, the electric potential of the gate electrodes of the TFTs 1803 and 1807 continues to drop, and the electric potential of the output terminal of the TFT 1803 also drops as shown by ΔVf in (ii) of FIG. 18B due to capacitive coupling by a capacitor 1805 between the gate electrode and the output terminal of the TFT 1803.

On the other hand, the signal input to the second signal input portion (Inb) switches from the L level to the H level. The electric potential of the gate electrodes of the TFTs 1802 and 1806 therefore rises, and reaches ($VDD_{LO}$–VthN) to be placed in a floating state.

The voltage between a gate and a source of the TFT 1802 and the voltage between a gate and a source of the TFT 1806 at this point become larger than VthN to turn the TFTs 1802 and 1806 on. The electric potential of output terminals of the TFTs 1802 and 1806 therefore rises.

Accompanying the increase in the electric potential of the output terminal of the TFT 1802 due to the capacitive coupling by the capacitor 1804 between the gate electrode and the output terminal of the TFF 1802, the electric potential of the gate electrode of the TFT 1802 in the floating state rises again to ($VDD_{LO}$–VthN+ΔVf).

The electric potential of the gate electrode of the TFT 1806 therefore also rises to ($VDD_{LO}$–VthN+ΔVf) at the same time, and the H level at the signal output portion (Out) rises normally to VDD.

The circuit shown in FIG. 18A obtains output with an amplitude from VDD to VSS for input of a signal with an amplitude between $VDD_{LO}$ and VSS, and therefore can be used as a level shifter.

Embodiment 6

A method of manufacturing a light emitting device using light emitting elements such as EL elements in a pixel portion is explained in Embodiment 6.

In accordance with the manufacturing processes disclosed in Embodiment 2, films up through a first interlayer insulating film and a second interlayer insulating film are formed as shown in FIGS. 8A and 8B.

Figure 19A:
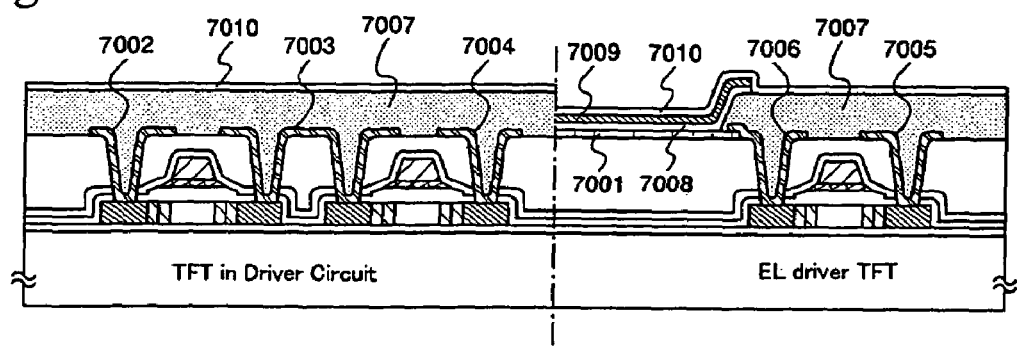
FIGS. 19A and 19B are diagrams showing an example of a process of manufacturing of a light emitting device.

Contact holes are then opened as shown in FIG. 19A. The contact holes are formed by using dry etching or wet etching in order to reach n-type impurity regions, source signal lines, gate signal lines, electric current supply lines, and gate electrodes, respectively.

Next, a transparent conductive film, typically ITO, is formed and patterned into a predetermined shape as an EL element anode 7001. A laminate film made from Ti, Al containing Ti, and Ti is formed, and patterned into a predetermined shape to form wiring electrodes 7002 to 7005 and a pixel electrode 7006. The film thickness of each of the laminate film may be set similarly to those of Embodiment 2. The pixel electrode 7006 is formed so as to overlap with the anode 7001 already formed and exhibit contact.

An insulating film containing silicon (typically a silicon oxide film) is formed next, an opening portion is formed in a location which is corresponding to the anode 7001 of the EL element, and a third interlayer insulating film 7007 is formed. A sidewall with a tapered shape can easily be formed here by using wet etching in forming the opening portion. Note that EL layer deterioration, cut step, and the like, which are caused by steps, become conspicuous problems in the case in which the sidewalls do not have a sufficiently smooth tapered shape, and it is therefore necessary to exert caution.

After an EL layer 7008 is formed next, an EL element cathode 7009 is formed from cesium (Cs) with a thickness equal to or less than 2 nm and silver (Ag) with a thickness equal to or less than 10 nm. Light generated in the EL layer is transmitted through the cathode 7009 to be emitted by making the film thickness of the cathode 7009 of the EL element extremely thin.

A protective film 7010 is formed next in order to protect the EL element. After work for attaching an FPC and the like is then performed, the light emitting device is complete.

Figure 19B:
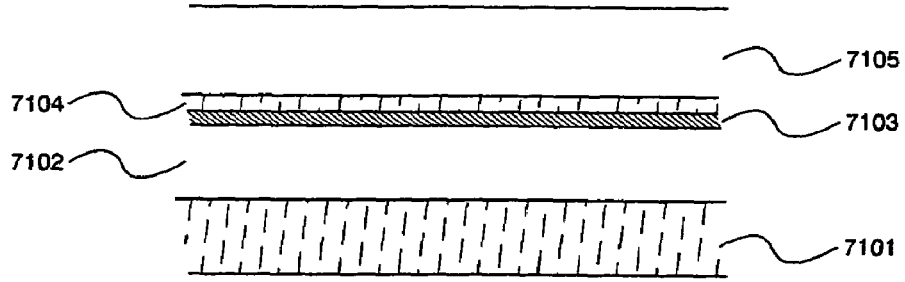

The detailed structure of the EL element in the light emitting device shown in FIG. 19A is shown in FIG. 19B in Embodiment 6. The anode 7101 of the EL element is made from a transparent conductive film, typically ITO. Reference numeral 7102 denotes an EL layer containing a light emitting layer. The cathode of the EL element is made from a Cs film 7103 and an Ag film 7104 each having an extremely thin thickness. Reference numeral 7105 denotes a protective film.

Light generated in an EL layer 7102 is emitted in an upward direction after transmitting through the Cs film 7103 and the Ag film 7104 constituting the cathode by forming the cathode of the EL element with an extremely thin film thickness. That is, the surface area of the light emitting area is not overwhelmed by a region where TFTs are formed, and therefore an aperture ratio of nearly 100% can be achieved.

Embodiment 7

A manufacturing process of a light emitting device by a method that differs from Embodiment 6 is explained in Embodiment 7.

In accordance with the manufacturing process disclosed in Embodiment 2, films up thorough a first interlayer insulating film and a second interlayer insulating film are formed as shown in FIGS. 8A and 8B.

Figure 20A:
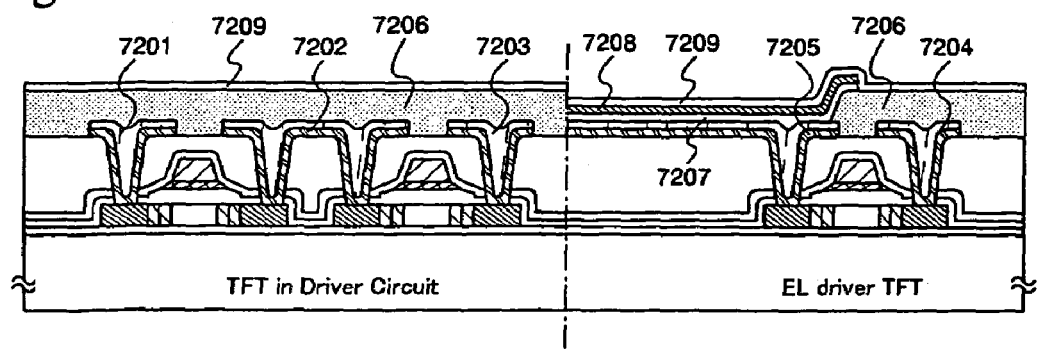
FIGS. 20A and 20B are diagrams showing an example of a process of manufacturing of a light emitting device.

Contact holes are then opened as shown in FIG. 20A. The contact holes are formed by using dry etching or wet etching in order to reach n-type impurity regions, source signal lines, gate signal lines, electric current supply lines, and gate electrodes, respectively.

Wirings 7201 to 7204 are then formed, and a pixel electrode 7205 which serves as an anode of an EL element is formed as a laminate film made from Ti, Al containing Ti, Ti, and a transparent conductive film.

An insulating film containing silicon (typically a silicon oxide film) is formed next, an opening portion is formed in a location which is corresponding to the anode of the EL element, and a third interlayer insulating film 7206 is formed. A sidewall with a tapered shape can easily be formed here by using wet etching in forming the opening portion. Note that EL layer deterioration, cut step, and the like caused by steps become conspicuous problems in the case in which the sidewalls do not have a sufficiently smooth tapered shape, and it is therefore necessary to exert caution.

After an EL layer 7207 is formed next, an EL element cathode 7208 is formed from cesium (Cs) with a thickness equal to or less than 2 nm, and silver (Ag) with a thickness equal to or less than 10 nm. Light generated in the EL layer is transmitted through the cathode 7208 to be emitted by making the film thickness of the cathode 7208 the EL element extremely thin.

A protective film 7209 is formed next in order to protect the EL element. After work for attaching an FPC and the like is then performed, the light emitting device is complete.

Figure 20B:
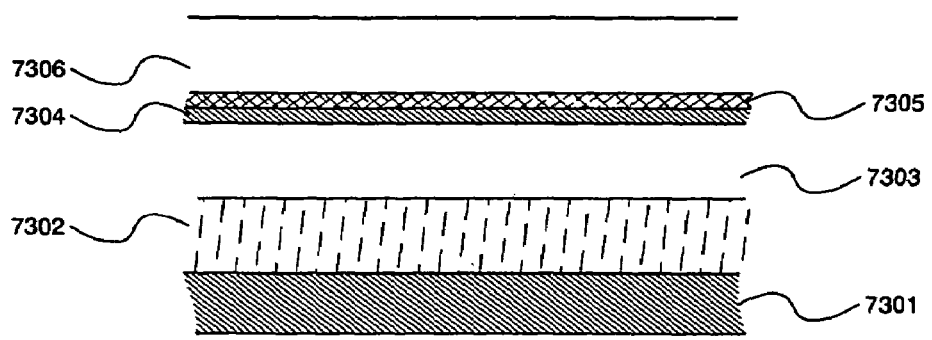

The detailed structure of the EL element in the light emitting device shown in FIG. 20A is shown in FIG. 20B. The anode of the EL element is made from a metallic film 7301 which is a laminate film of Ti, Al containing Ti, and Ti, and a transparent conductive film 7302, typically ITO. Reference numeral 7303 denotes an EL layer containing a light emitting layer. The cathode of the EL element is made from a Cs film 7304 and an Ag film 7305 each having an extremely thin thickness. Reference numeral 7306 denotes a protective film.

The light emitting device manufactured in accordance with Embodiment 7 has an advantage that an aperture ratio of nearly 100% can be achieved, similar to the display device disclosed in Embodiment 6. In addition, it is possible to perform patterning of the metallic film made from a laminate of Ti, Al containing Ti, Ti, and the transparent conductive film by using a common photomask in forming the wirings and the pixel electrode. It therefore becomes possible to reduce the number of photomasks and to simplify processing.

Embodiment 8

In the present invention, capacitor means formed in order to perform boot strap operations may utilize a capacitance between a gate and a source of a TFT, and the capacitor means may also be formed by a pair of electrodes of two materials selected from a wiring, a gate electrode, an active layer, and the like, and an insulating layer sandwiched between the pair of electrodes.

Figure 21:
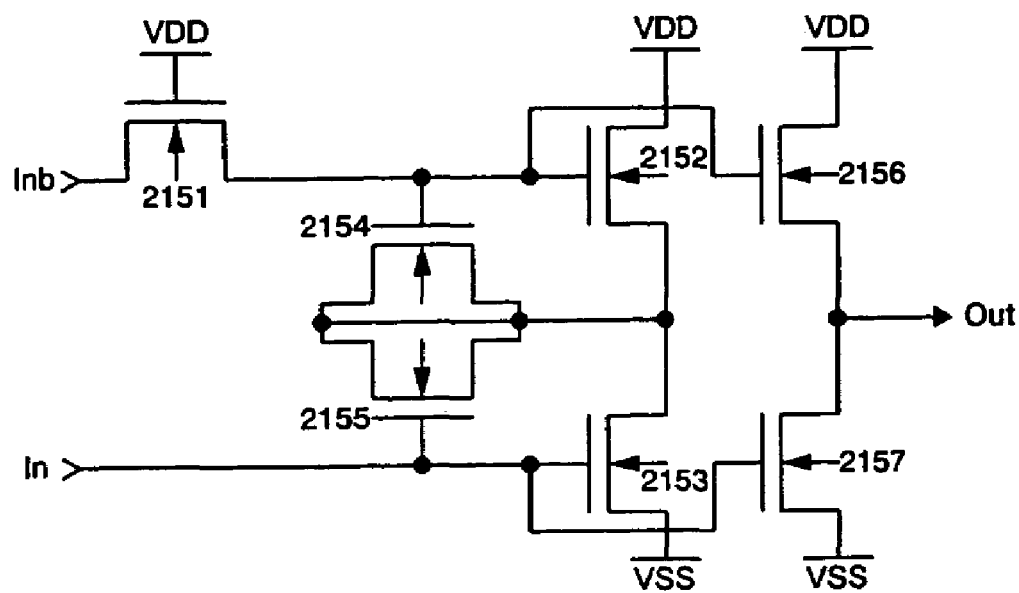
FIG. 21 is a diagram showing an embodiment of the present invention.

FIG. 21 shows a structure in which capacitor means 2154 and 2155 are formed similarly to TFTs. A source region and a drain region of a TFT are mutually connected to function as capacitor means in which a gate electrode and a channel forming region below are taken as an electrode pair and a gate insulating film is taken as an insulating film. In addition, the gate electrode and a wiring material connected to a source region and a drain region may be taken as an electrode pair, and an interlayer insulating film between the gate material and the wiring material may be taken as an insulating film to function as the capacitor means.

Figure 22A:
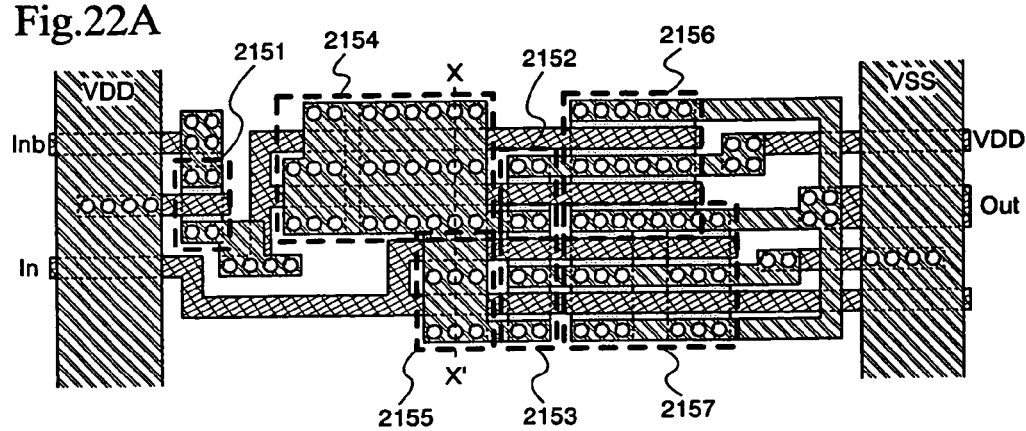
FIGS. 22A to 22C are mask-layout diagrams of the structure shown in FIG. 21, and a photograph of a manufactured circuit.

An example of a mask layout, in the case of manufacturing an actual circuit as the structure shown in FIG. 21, is shown in FIG. 22A. It is noted that electric power sources, signals input from respective input terminals, signals output from respective output terminals, reference numerals for TFTs, and the like all correspond to the circuit diagram shown in FIG. 21.

Figure 22B:
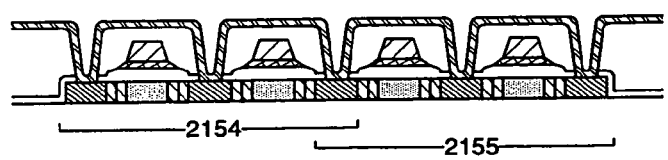

FIG. 22B is a diagram showing a cross sectional diagram of FIG. 22A cut along a line segment X–X'. The source regions and the drain regions of the respective TFTs are connected by a wiring material formed over the TFTs 2154 and 2155.

Figure 22C:
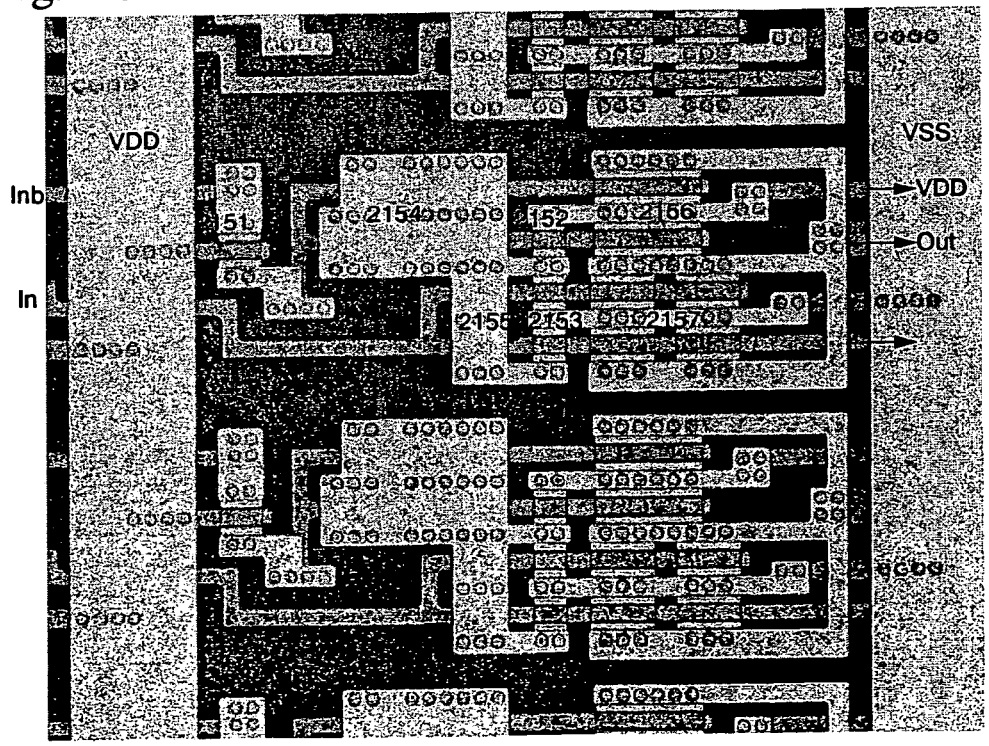

FIG. 22C shows a photograph of an actual circuit manufactured by using the mask layout shown in FIG. 22A. It is noted that reference numerals and other symbols used in the photograph correspond to those in FIG. 21 and FIG. 22A.

Embodiment 9

The present invention can be applied to fabrication of a display device used for various electronic devices. Such electronic devices include a portable information terminal (electronic notebook, mobile computer, cellular phone, etc.), a video camera, a digital camera, a personal computer, a television, cellular phone, and the like. FIG. 17 shows examples of those.

Figure 17A:
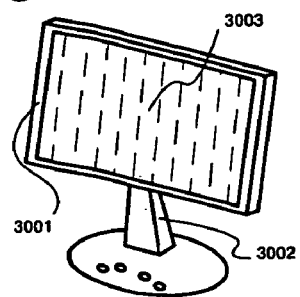
FIGS. 17A to 17G are diagrams showing examples of electronic equipment to which it is possible to apply the present invention.

FIG. 17A shows a liquid crystal display device or an OLED display which is constituted by a housing 3001, a supporting stand 3002, a display portion 3003, and the like. The present invention can be applied to the fabrication of the display portion 3003.

Figure 17B:
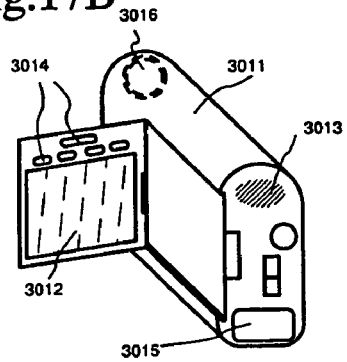

FIG. 17B shows a video camera which is constituted by a main body 3011, a display portion 3012, an audio input portion 3013, an operation switch 3014, a battery 3015, an image receiving portion 3016, and the like. The present invention can be applied to the fabrication of the display portion 3012.

Figure 17C:
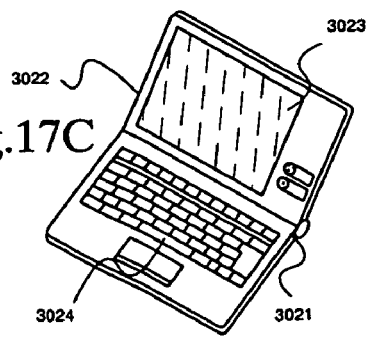

FIG. 17C shows a notebook personal computer which is constituted by a main body 3021, a housing 3022, a display portion 3023, a keyboard 3024, and the like. The present invention can be applied to the fabrication of the display portion 3023.

Figure 17D:
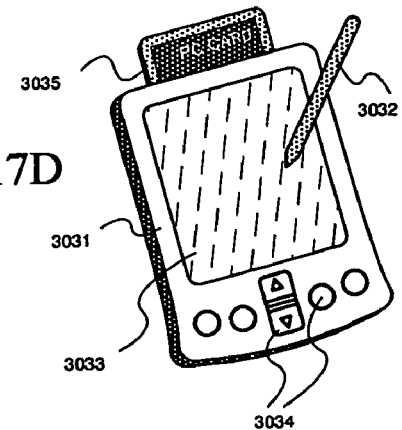

FIG. 17D shows a portable information terminal which is constituted by a main body 3031, a stylus 3032, a display portion 3033, an operation button 3034, an external interface 3035, and the like. The present invention can be applied to the fabrication of the display portion 3033.

Figure 17E:
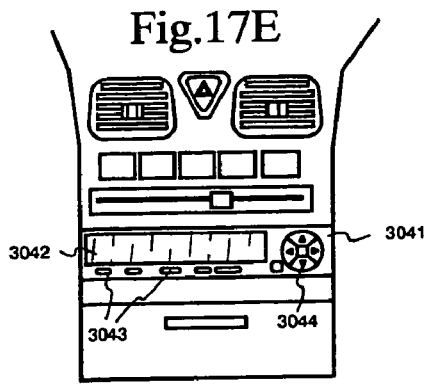

FIG. 17E shows a sound reproducing system, specifically an on-vehicle audio apparatus, which is constituted by a main body 3041, a display portion 3042, operation switches 3043 and 3044, and the like. The present invention can be applied to the fabrication of the display portion 3042. Additionally, although the on-vehicle audio apparatus is illustrated in this example, the invention can also be used for a portable or household audio apparatus.

Figure 17F:
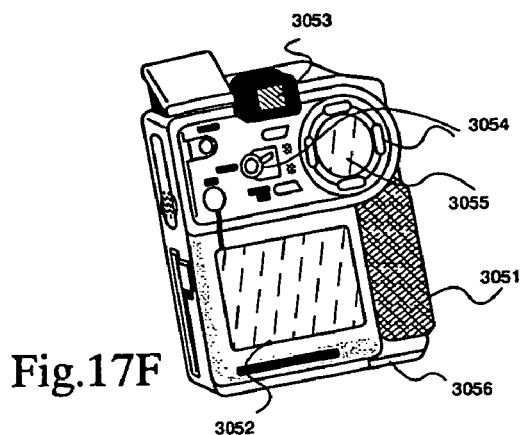

FIG. 17F shows a digital camera which is constituted by a main body 3051, a display portion (A) 3052, an eyepiece portion 3053, an operation switch 3054, a display portion (B) 3055, a battery 3056, and the like. The present invention can be applied to the fabrication of the display portion (A) 3052 and the display portion (B) 3055.

Figure 17G:
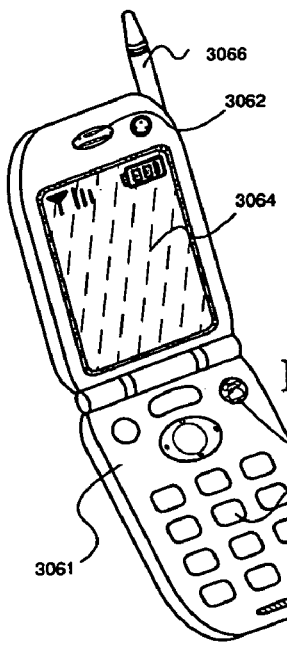

FIG. 17G shows a cellular phone which is constituted by a main body 3061, an audio output portion 3062, an audio input portion 3063, a display portion 3064, an operation switch 3065, an antenna 3066, and the like. The present invention can be applied to the fabrication of the display portion 3064.

Note that, the examples set forth above are merely examples, and the present invention is not limited to these applications.

With the present invention, it becomes possible to construct a semiconductor device and a pixel portion by using single polarity TFTs.

Further, operational reliability can be increased and the surface area occupied by circuits can be reduced, by making the load driving ability very high as a buffer circuit used in a driver circuit.

In addition, when a display device is manufactured by using single polarity TFTs, it becomes possible to omit a portion of processing steps for adding impurities and to contribute to reducing the costs for manufacturing the display device.

What is claimed is:

1. A cellular phone comprising:
   an audio output portion, an audio input portion, an operation switch, a display portion, the display portion comprising:
   first and second transistors each comprising an input terminal electrically connected to a first electric power source;

third and fourth transistors each comprising an input terminal electrically connected to a second electric power source;
a voltage compensator circuit comprising: a fifth transistor comprising an output terminal electrically connected to a gate electrode of the first transistor and a gate electrode of the second transistor; and a capacitor between the output terminal of the fifth transistor and an output terminal of the first transistor;
a first signal input portion for inputting a first signal to a gate electrode of the third transistor and a gate electrode of the fourth transistor;
a second signal input portion for inputting a second signal to an input terminal of the fifth transistor; and
a signal output portion,
wherein each of the first through the fifth transistors have the same conductivity type,
wherein the output terminal of the first transistor and an output terminal of the third transistor are electrically connected,
wherein an output terminal of the second transistor and an output terminal of the fourth transistor are electrically connected to the signal output portion,
wherein a gate electrode of the fifth transistor is electrically connected to the first electric power source or to a third electric power source, and
wherein the voltage compensator circuit compensates for amplitude attenuation of a signal output from the signal output portion.

2. A cellular phone comprising:
an audio output portion, an audio input portion, an operation switch, a display portion, the display portion comprising:
first and second transistors each comprising an input terminal electrically connected to a first electric power source;
third and fourth transistors each comprising an input terminal electrically connected to a second electric power source;
a voltage compensator circuit comprising: a fifth transistor comprising an output terminal electrically connected to a gate electrode of the first transistor and a gate electrode of the second transistor; a first capacitor between a gate electrode of the first transistor and an output terminal of the first transistor; and a second capacitor between a gate electrode of the third transistor and an output terminal of the third transistor;
a first signal input portion for inputting a first signal to a gate electrode of the third transistor and a gate electrode of the fourth transistor;
a second signal input portion for inputting a second signal to an input terminal of the fifth transistor; and
a signal output portion,
wherein each of the first through the fifth transistors have the same conductivity type,
wherein the output terminal of the first transistor and the output terminal of the third transistor are electrically connected,
wherein an output terminal of the second transistor and an output terminal of the fourth transistor are electrically connected to the signal output portion,
wherein a gate electrode of the fifth transistor is electrically connected to the first electric power source or to a third electric power source, and
wherein the voltage compensator circuit compensates for amplitude attenuation of a signal output from the signal output portion.

3. A cellular phone according to claim 1, wherein the capacitor is formed by:
two electrodes selected from the group consisting of an active layer, a gate electrode, and a wiring; and
an insulating material between the two electrodes.

4. A cellular phone according to claim 2, wherein one of the first and second capacitor means is formed by:
two electrodes selected from the group consisting of an active layer, a gate electrode, and a wiring; and
an insulating material between the two electrodes.

5. A cellular phone according to claim 1,
wherein electric potential of the second electric power source is less than electric potential of the first electric power source when the conductivity type is n-channel, and
wherein the electric potential of the second electric power source is more than the electric potential of the first electric power source when the conductivity type is p-channel.

6. A cellular phone according to claim 2,
wherein electric potential of the third electric power source is more than electric potential of the second electric power source and less than electric potential of the first electric power source when the conductivity type is n-channel, and
wherein the electric potential of the third electric power source is less than the electric potential of the second electric power source and more than the electric potential of the first electric power source when the conductivity type is p-channel.

7. A cellular phone comprising:
an audio output portion, an audio input portion, an operation switch, a display portion, the display portion comprising:
first and second transistors each comprising an input terminal electrically connected to a first electric power source;
third and fourth transistors each comprising an input terminal electrically connected to a second electric power source;
a voltage compensator circuit comprising: a fifth transistor comprising an input terminal and an output terminal that is electrically connected to a gate electrode of the first transistor and a gate electrode of the second transistor; a sixth transistor comprising an input terminal electrically connected to the second electric power source and an output terminal electrically connected to the gate electrode of the first transistor and the gate electrode of the second transistor; and a capacitor between the gate electrode and an output terminal of the first transistor;
a first signal input portion for inputting a first signal to a gate electrode of the third transistor, a gate electrode of the fourth transistor, and a gate electrode of the sixth transistor;
a second signal input portion for inputting a second signal to a gate electrode of the fifth transistor; and
a signal output portion,
wherein each of the first through the sixth transistors have the same conductivity type,
wherein the output terminal of the first transistor and an output terminal of the third transistor are electrically connected,
wherein an output terminal of the second transistor and an output terminal of the fourth transistor are electrically connected to the signal output portion, wherein the input terminal of the fifth transistor is electrically connected to the first electric power source or to a third electric power source, and wherein the voltage compensator circuit compensates for amplitude attenuation of a signal output from the signal output portion.

8. A cellular phone comprising:

an audio output portion, an audio input portion, an operation switch, a display portion, the display portion comprising:

first and second transistors each comprising an input terminal electrically connected to a first electric power source;

third and fourth transistors each comprising an input terminal electrically connected to a second electric power source;

a voltage compensator circuit comprising: a fifth transistor comprising an input terminal and an output terminal that is electrically connected to a gate electrode of the first transistor and a gate electrode of the second transistor; a sixth transistor comprising an input terminal electrically connected to the second electric power source and an output terminal electrically connected to the gate electrode of the first transistor and the gate electrode of the second transistor; a first capacitor between the gate electrode and an output terminal of the first transistor; and a second capacitor between a gate electrode and an output terminal of the first transistor;

a first signal input portion for inputting a first signal to the gate electrode of the third transistor, a gate electrode of the fourth transistor, and a gate electrode of the sixth transistor;

a second signal input portion for inputting a second signal to a gate electrode of the fifth transistor; and a signal output portion, wherein each of the first through the sixth transistors have the same conductivity type, wherein the output terminal of the first transistor and an output terminal of the third transistor are electrically connected, wherein an output terminal of the second transistor and an output terminal of the fourth transistor are electrically connected to the signal output portion, wherein the input terminal of the fifth transistor is electrically connected to the first electric power source or to a third electric power source, and wherein the voltage compensator circuit compensates for amplitude attenuation of a signal output from the signal output portion.

9. A cellular phone according to claim 7, wherein the capacitor is formed by:

two electrodes selected from the group consisting of an active layer, a gate electrode, and a wiring; and an insulating material between the two electrodes.

10. A cellular phone according to claim 8, wherein one of the first and second capacitor means is formed by:

two electrodes selected from the group consisting of an active layer, a gate electrode, and a wiring; and an insulating material between the two electrodes.

11. A cellular phone according to claim 7, wherein electric potential of the second electric power source is less than electric potential of the first electric power source when the conductivity type is n-channel, and wherein the electric potential of the second electric power source is more than the electric potential of the first electric power source when the conductivity type is p-channel.

12. A cellular phone according to claim 8, wherein electric potential of the second electric power source is less than electric potential of the first electric power source when the conductivity type is n-channel, and wherein the electric potential of the second electric power source is more than the electric potential of the first electric power source when the conductivity type is p-channel.

13. A cellular phone according to claim 1, wherein the cellular phone comprises at least one selected from the group consisting of an inverter, a buffer, a level shifter, and an amplifier.

14. A cellular phone according to claim 2, wherein the cellular phone comprises at least one selected from the group consisting of an inverter, a buffer, a level shifter, and an amplifier.

15. A cellular phone according to claim 7, wherein the cellular phone comprises at least one selected from the group consisting of an inverter, a buffer, a level shifter, and an amplifier.

16. A cellular phone according to claim 8, wherein the cellular phone comprises at least one selected from the group consisting of an inverter, a buffer, a level shifter, and an amplifier.

17. A cellular phone comprising an audio output portion, an audio input portion, an operation switch, a pixel portion and a driver circuit, the driver circuit comprising:

first and second transistors each comprising an input terminal electrically connected to a first electric power source;

third and fourth transistors each comprising an input terminal electrically connected to a second electric power source;

a voltage compensator circuit comprising: a fifth transistor comprising an output terminal electrically connected to a gate electrode of the first transistor and a gate electrode of the second transistor; and a capacitor between the output terminal of the fifth transistor and an output terminal of the first transistor;

a first signal input portion for inputting a first signal to a gate electrode of the third transistor and a gate electrode of the fourth transistor;

a second signal input portion for inputting a second signal to an input terminal of the fifth transistor; and a signal output portion, wherein each of the first through the fifth transistors have the same conductivity type, wherein the output terminal of the first transistor and an output terminal of the third transistor are electrically connected, wherein an output terminal of the second transistor and an output terminal of the fourth transistor are electrically connected to the signal output portion, wherein a gate electrode of the fifth transistor is electrically connected to the first electric power source or to a third electric power source, and wherein the voltage compensator circuit compensates for amplitude attenuation of a signal output from the signal output portion.

18. A cellular phone comprising an audio output portion, an audio input portion, an operation switch, a pixel portion and a driver circuit, the driver circuit comprising:

first and second transistors each comprising an input terminal electrically connected to a first electric power source;

third and fourth transistors each comprising an input terminal electrically connected to a second electric power source;

a voltage compensator circuit comprising: a fifth transistor comprising an output terminal electrically connected to a gate electrode of the first transistor and a gate electrode of the second transistor; a first capacitor between a gate electrode of the first transistor and an output terminal of the first transistor; and a second capacitor between a gate electrode of the third transistor and an output terminal of the third transistor;

a first signal input portion for inputting a first signal to a gate electrode of the third transistor and a gate electrode of the fourth transistor;

a second signal input portion for inputting a second signal to an input terminal of the fifth transistor; and a signal output portion, wherein each of the first through the fifth transistors have the same conductivity type, wherein the output terminal of the first transistor and the output terminal of the third transistor are electrically connected, wherein an output terminal of the second transistor and an output terminal of the fourth transistor are electrically connected to the signal output portion, wherein a gate electrode of the fifth transistor is electrically connected to the first electric power source or to a third electric power source, and wherein the voltage compensator circuit compensates for amplitude attenuation of a signal output from the signal output portion.

19. A cellular phone according to claim 17, wherein the capacitor is formed by:

two electrodes selected from the group consisting of an active layer, a gate electrode, and a wiring; and an insulating material between the two electrodes.

20. A cellular phone according to claim 18, wherein one of the first and second capacitor means is formed by:

two electrodes selected from the group consisting of an active layer, a gate electrode, and a wiring; and an insulating material between the two electrodes.

21. A cellular phone according to claim 17, wherein electric potential of the second electric power source is less than electric potential of the first electric power source when the conductivity type is n-channel, and wherein the electric potential of the second electric power source is more than the electric potential of the first electric power source when the conductivity type is p-channel.

22. A cellular phone according to claim 18, wherein electric potential of the third electric power source is more than electric potential of the second electric power source and less than electric potential of the first electric power source when the conductivity type is n-channel, and wherein the electric potential of the third electric power source is less than the electric potential of the second electric power source and more than the electric potential of the first electric power source when the conductivity type is p-channel.

23. A cellular phone comprising an audio output portion, an audio input portion, an operation switch, a pixel portion and a driver circuit, the driver circuit comprising:

first and second transistors each comprising an input terminal electrically connected to a first electric power source;

third and fourth transistors each comprising an input terminal electrically connected to a second electric power source;

a voltage compensator circuit comprising: a fifth transistor comprising an input terminal and an output terminal that is electrically connected to a gate electrode of the first transistor and a gate electrode of the second transistor; a sixth transistor comprising an input terminal electrically connected to the second electric power source and an output terminal electrically connected to the gate electrode of the first transistor and the gate electrode of the second transistor; and a capacitor between the gate electrode and an output terminal of the first transistor;

a first signal input portion for inputting a first signal to a gate electrode of the third transistor, a gate electrode of the fourth transistor, and a gate electrode of the sixth transistor;

a signal output portion, wherein each of the first through the sixth transistors have the same conductivity type, wherein the output terminal of the first transistor and an output terminal of the third transistor are electrically connected, wherein an output terminal of the second transistor and an output terminal of the fourth transistor are electrically connected to the signal output portion, wherein a gate electrode and the input terminal of the fifth transistor are electrically connected to the first electric power source or to a third electric power source, and wherein the voltage compensator circuit compensates for amplitude attenuation of a signal output from the signal output portion.

24. A cellular phone comprising an audio output portion, an audio input portion, an operation switch, a pixel portion and a driver circuit, the driver circuit comprising:

first and second transistors each comprising an input terminal electrically connected to a first electric power source;

third and fourth transistors each comprising an input terminal electrically connected to a second electric power source;

a voltage compensator circuit comprising: a fifth transistor comprising an input terminal and an output terminal that is electrically connected to a gate electrode of the first transistor and a gate electrode of the second transistor; a sixth transistor comprising an input terminal electrically connected to the second electric power source and an output terminal electrically connected to the gate electrode of the first transistor and the gate electrode of the second transistor; a first capacitor between the gate electrode and an output terminal of the first transistor; and a second capacitor between a gate electrode and an output terminal of the first transistor;

a first signal input portion for inputting a first signal to the gate electrode of the third transistor, a gate electrode of the fourth transistor, and a gate electrode of the sixth transistor;

a signal output portion, wherein each of the first through the sixth transistors have the same conductivity type, wherein the output terminal of the first transistor and an output terminal of the third transistor are electrically connected, wherein an output terminal of the second transistor and an output terminal of the fourth transistor are electrically connected to the signal output portion, wherein a gate electrode and the input terminal of the fifth transistor are electrically connected to the first electric power source or to a third electric power source, and wherein the voltage compensator circuit compensates for amplitude attenuation of a signal output from the signal output portion.

25. A cellular phone according to claim 23, wherein the capacitor is formed by:

two electrodes selected from the group consisting of an active layer, a gate electrode, and a wiring; and an insulating material between the two electrodes.

26. A cellular phone according to claim 24, wherein one of the first and second capacitor means is formed by:

two electrodes selected from the group consisting of an active layer, a gate electrode, and a wiring; and an insulating material between the two electrodes.

27. A cellular phone according to claim 23, wherein electric potential of the second electric power source is less than electric potential of the first electric power source when the conductivity type is n-channel, and wherein the electric potential of the second electric power source is more than the electric potential of the first electric power source when the conductivity type is p-channel.

28. A cellular phone according to claim 24, wherein electric potential of the second electric power source is less than electric potential of the first electric power source when the conductivity type is n-channel, and wherein the electric potential of the second electric power source is more than the electric potential of the first electric power source when the conductivity type is p-channel.

29. A cellular phone according to claim 17, wherein the cellular phone comprises at least one selected from the group consisting of an inverter, a buffer, a level shifter, and an amplifier.

30. A cellular phone according to claim 18, wherein the cellular phone comprises at least one selected from the group consisting of an inverter, a buffer, a level shifter, and an amplifier.

31. A cellular phone according to claim 23, wherein the cellular phone comprises at least one selected from the group consisting of an inverter, a buffer, a level shifter, and an amplifier.

32. A cellular phone according to claim 24, wherein the cellular phone comprises at least one selected from the group consisting of an inverter, a buffer, a level shifter, and an amplifier.

* * * * *